(12) United States Patent
Inaba et al.

(10) Patent No.: US 6,181,618 B1
(45) Date of Patent: Jan. 30, 2001

(54) DYNAMIC TYPE RAM

(75) Inventors: Tsuneo Inaba, Yokohama; Kenji Tsuchida, Kawasaki, both of (JP); Junichi Okamura, S. Burlington, VT (US)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/037,681

(22) Filed: Mar. 10, 1998

(30) Foreign Application Priority Data

Mar. 11, 1997 (JP) .................................................. 9-055968
Feb. 6, 1998 (JP) ................................................ 10-025333

(51) Int. Cl.[7] ...................................................... G11C 7/00
(52) U.S. Cl. ........................ 365/203; 365/207; 365/196; 365/189.03
(58) Field of Search ................................ 365/202, 203, 365/207, 184, 189.07, 233, 196

(56) References Cited

U.S. PATENT DOCUMENTS

| | | | |
|---|---|---|---|
| 4,477,886 | * 10/1984 | Au ........................................ | 365/222 |
| 5,257,232 | 10/1993 | Dhong et al. ......................... | 361/203 |
| 5,640,355 | * 6/1997 | Muraoka et al. ..................... | 365/207 |
| 5,815,451 | * 9/1998 | Tsuchida .............................. | 365/203 |
| 5,969,998 | * 10/1999 | Oowaki et al. .................. | 365/189.09 |
| 5,973,991 | * 10/1999 | Tsuchida et al. .................... | 365/233 |

* cited by examiner

Primary Examiner—David Nelms
Assistant Examiner—Thong Le
(74) Attorney, Agent, or Firm—Banner & Witcoff, Ltd.

(57) ABSTRACT

The present invention is to provide a semiconductor memory device capable of realizing a high speed sensing operation and an enlarged sense margin, for ensuring the sensing operation even with a low power source voltage by connecting the bit line of the memory cell array portion and the bit line of the sense amplifier portion via the P-type transfer gate, having the bit line amplitude of the sense amplifier potion larger than the bit line amplitude of the memory cell array portion, and having different precharge voltages for the bit line of the sense amplifier portion and the bit line of the memory cell array portion.

42 Claims, 15 Drawing Sheets

DYNAMIC TYPE RAM

BACKGROUND OF THE INVENTION

The present invention relates to a semiconductor memory device having dynamic type RAM (DRAM) cells integrated and arranged, more specifically, to a semiconductor memory device capable of realizing a low power consumption, an enlarged operation margin and a high speed operation of a sense amplifier, a high reliability and a high current driving ability of a transistor by a transmission gate comprising a P-type MOS transistor.

Recently, according to the increase of the demand for portable apparatus, smaller appliances mounted with a semiconductor device are demanded. Therefore, the mounted semiconductor device is required to be highly integrated and to consume low power so as to prolong the time to be used with a battery.

Among semiconductor memory devices, since a memory cell has a comparatively simple structure in a semiconductor memory device such as DRAM, a high integration has been achieved. According to the high integration, patterns and elements have been even minute to deteriorate the pressure resistance, and the like so that a lower voltage is needed for the power source voltage for driving according to the scaling rule so as to ensure the reliability and a lower power consumption.

For example, in a 16 M bit DRAM, the power source voltage is being shifted from the conventional Vcc=5V to Vcc=3.3V. Further, in a 256 M bit DRAM, the power source voltage to be supplied is considered to become Vcc=2.5V.

Furthermore, as a minimum processing size, about 0.15 μm is considered to be necessary. In a 1 G bit DRAM, a low power source voltage of about Vcc=1.8V is expected.

In these DRAMs, since a signal charge amount stored in a memory cell as data is minute, a highly sensitive bit line sense amplifier is needed for detecting, amplifying and reading it to the outside. Since the signal amount read out from the memory cell to be detected and amplified by the bit line sense amplifier is proportional to the power source voltage, when the power source voltage is scaled and lowered as mentioned above, the read signal amount decreases proportionally.

In general, as the bit line sense amplifier, a dynamic type differential amplifying circuit comprising an N-type sense amplifier where two sets of NMOS transistors (hereinafter NMOS is referred to as N-type) are connected by cross-coupling, and a P-type sense amplifier where two sets of PMOS transistors (hereinafter PMOS is referred to as P-type) are similarly connected by cross-coupling is used.

As shown in FIG. 28, as a precharge voltage of a bit line, which serves as the input terminal to the sense amplifier, the Vcc/2 precharge method, which is ½ of the power source voltage is used.

To explain the Vcc/2 precharge method simply, in a precharge cycle where the outside control signal RAS bar (hereinafter bar represents a reverse signal ¯) is at the "H" level, a bit line pair is precharged to Vcc/2. When the RAS bar signal shifts from the "H" to the "L" level to be in a state where the DRAM can read and write (active mode), the bit line precharge/equalize circuit is shut off so that the bit line precharged to be Vcc/2 becomes floating so that the word line WL selected by the external input address is driven, and data are read from the memory cell to the bit line.

The bit line sense amplifier is activated so that a minute signal read out to the bit line is detected and amplified.

More specifically, the "L" level side of the bit line pair is discharged to a ground voltage (Vss) by the above-mentioned N-type sense amplifier. On the other hand, the "H" level side of the bit line pair is charged to the power source voltage (Vcc) by the P-type sense amplifier. After completing the reading operation, the bit line is equalized and precharged to the Vcc/2 voltage again.

As a method for achieving a low power source voltage in a semiconductor memory device such as the above-mentioned DRAM, a method of reducing the bit line discharge current by having a smaller bit line voltage amplitude has been advocated conventionally.

However, in the case with a small amplitude for the bit line voltage amplitude, since the voltage difference between a gate and a source of the transistor comprising the flip flop type sense amplifier becomes small, a problem of deterioration of the operation speed of the sense amplifier is involved. In a semiconductor memory device having a memory capacity of the G bit level, since the power source voltage Vcc becomes extremely small as 1.8V or less, a voltage between the gate and the source necessary for the sense amplifier transistor operation, that is, a voltage not less than the threshold voltage of the sense amplifier transistor cannot be obtained between the gate and the source of the sense amplifier transistor to disable the sense operation, and thus it is problematic.

That is, in the case of a DRAM using the above-mentioned Vcc/2 precharge method, due to the lower source voltage, in the sense amplifier operation, the voltage between the gate and the source (Vcc/2) to be applied to the transistor comprising the sense amplifier itself inevitably lowers. As a consequence, there is a risk that the sense operation is drastically delayed or the sense operation cannot be implemented.

For example, in the case of the source voltage Vcc=1.8V, only Vcc=0.9V is applied between the gate and the source of the sense amplifier transistor. Actually, the voltage is lowered by the resistance of the common source wiring of the sense amplifier transistor, in particular, in the initial sensing time, the value can be further smaller.

On the other hand, the absolute value |Vth| of the threshold voltage of the sense amplifier transistor (it is a positive voltage in an N-type sense amplifier, but a negative voltage in a P-type sense amplifier) needs to be at least 0.3V to 0.5V in order to guarantee the threshold value irregularity and the cut off characteristic.

At the time of the initial sensing, the substantial |Vth| is further raised in combination with the back gate effect of the sense amplifier transistor. Therefore, the voltage between the gate and the source of the sense amplifier transistor and the threshold voltage are extremely close at the time of the initial sensing so that the initial sensing is drastically delayed. And thus a serious problem is involved in terms of the high speed operation of the DRAM.

Among the transistors used in the DRAM, a highest voltage (boosting voltage) is applied to the gate electrode of the memory cell transistor. This is because the "H" level needs to be written in the memory cell. The gate voltage needed therefor is represented by VBLH+Vth'. Herein VBLH represents the "H" level voltage, and Vth' represents the threshold voltage of the memory cell transistor where a negative voltage is applied to the back gate (substrate) of the memory cell transistor and the source voltage is VBLH.

In order to maximize the charge to be accumulated in the memory cell capacitor in general, VBLH is equal to the source voltage in the chip (Vdd).

In general, since the gate oxide film of the same thickness is used for all the transistors in the chip for the production cost reduction, a transistor, of which gate electrode is not applied with the boosting voltage inevitably uses the thick gate oxide film the same as the memory cell transistor. Therefore, the transistors used in the DRAM have a problem in that their performance such as the current driving ability is low compared with a transistor of a logical semiconductor, and the like.

In order to improve the transistor performance by having a thinner gate oxide film, the boosting voltage can be lowered to reduce the voltage to be applied to the gate oxide film of the memory cell transistor. However, in that case, the source voltage in the chip inevitably becomes low so that since only ½ Vdd can be applied between the gate and the source of the transistor comprising the sense amplifier at most in the general ½ Vdd precharge method, a problem is involved in that the sense amplifier cannot function.

In general, an equalize circuit is provided in a bit line pair, a data line pair, a sense amplifier driving line, and the like. For example, a bit line equalize circuit conventionally comprises only N-type transistors as shown in FIG. 29.

Since a large capacity is aimed at in a semiconductor memory these days, the redundancy technique for saving a defect memory cell generated in the production is in dispensable. However, even if it is saved, the defect cannot be eliminated.

For example, in the case a defect is generated in the short circuit between the bit line and the word line shown in FIG. 30, the memory cell is replaced (saved) by the redundancy technique. However, as mentioned above, since the defect remains as it is, at the time of operating the equalize circuit, through current flows in the route shown by the dot line in the figure, that is, VBL→PRCH→bit line→word line→row decoder.

When the through current is large, or a large number of short circuit defects are generated between the bit line and the word line, although the memory cell can be saved with the redundancy technique, since the current consumption becomes larger than the standard range, the chip becomes "defect".

In order to restrain the through current, a method of inserting a current limiting circuit between the precharge circuit and the precharge voltage supply line as shown in FIG. 31 is proposed. It is preferable that the current limiting circuit comprises a P-type transistor. At the time, problems are involved in that (1) the sense amplifying area is enlarged due to the necessity of the well separation with respect to the equalize/precharge circuit portion, and (2) a wiring is required for connecting the precharge circuit and the current limiting circuit.

BRIEF SUMMARY OF THE INVENTION

An object of the present invention is to provide a semiconductor memory device capable of realizing a high speed sensing operation and an enlarged sense margin by having a bit line amplitude of a sense amplifier portion larger than a bit line amplitude of a memory cell array portion to have different voltages for a precharge voltage of the bit line of the sense amplifier portion and a precharge voltage of the bit line of the memory cell array portion.

A dynamic type RAM of the present invention comprises a sense amplifier portion having a memory cell array portion comprising a plurality of memory cells capable of writing and reading data electrically, connected to bit lines to make a plurality of sets with the memory cells and a plurality of word lines for detecting and amplifying the data stored in the memory cells from the bit lines via transfer gates, wherein the voltage amplitude of a signal to be applied to the bit lines connected to the memory cell array portion is different from the voltage amplitude of a signal to be applied to the bit lines connected to the sense amplifier portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter embodiments of the present invention will be explained in detail with reference to the accompanied drawings.

Figure 1:
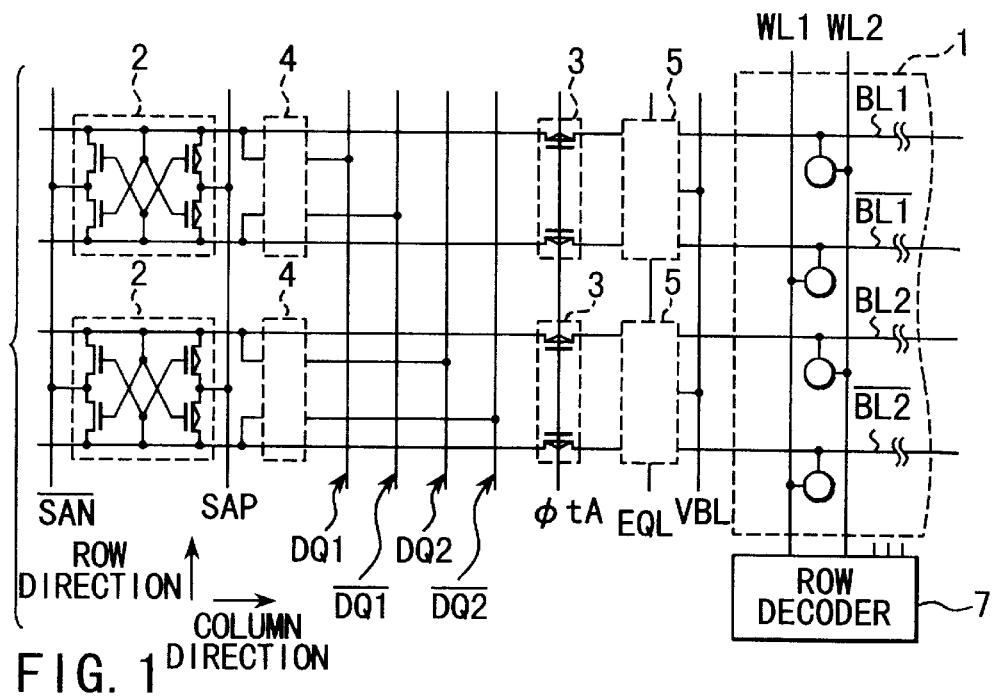
FIG. 1 is a schematic diagram of the configuration of a dynamic type RAM (DRAM) applied with the present invention.

A dynamic type RAM (DRAM) having a block configuration as shown in FIG. 1 is used in a semiconductor memory device of the present invention.

In the configuration, by having the voltage amplitude of pairs of bit lines BL1, BL1 bar, BL2, BL2 bar, (hereinafter bar denotes the reverse signal⁻), which serve as complementary lines with respect to a memory cell array portion 1, smaller than the range of the power source voltage Vcc, a small power consumption is to be realized. In addition to that, by having the voltage amplitude between the bit lines in a sense amplifier portion 2 larger than the voltage amplitude of the bit lines of the memory cell array portion 1, and having the precharge voltage of the bit lines of the sense amplifier portion 2 and the precharge voltage of the bit lines of the memory cell array portion 1 different, the voltage difference between the gate and the source of the transistor comprising the sense amplifier can be large so that a high speed and secure sense amplifying operation can be realized even when the voltage amplitude of the bit lines of the memory cell array portion 1 is small.

By connecting the sense amplifier portion 2 to the memory cell array portion 1 via a P-type transfer gate 3 comprising a PMOS transistor (hereinafter PMOS is referred to as P-type), a large bit line voltage amplitude in the sense amplifier portion 2 is converted to a small bit line amplitude in the memory cell array portion 1 without the need of adding a new circuit.

In an embodiment later described, by connecting a P-type sense amplifier comprising a P-type transistor and an N-type sense amplifier comprising an NMOS transistor (hereinafter NMOS is referred to as N-type) to the memory cell array portion via an N-type transfer gate comprising an N-type transistor and a P-type transfer gate, the same effect can be achieved.

Further, an ordinary column selector 4, a bit line equalizer 5, a column decoder (not shown), and a row decoder 7 are provided.

Figure 2:
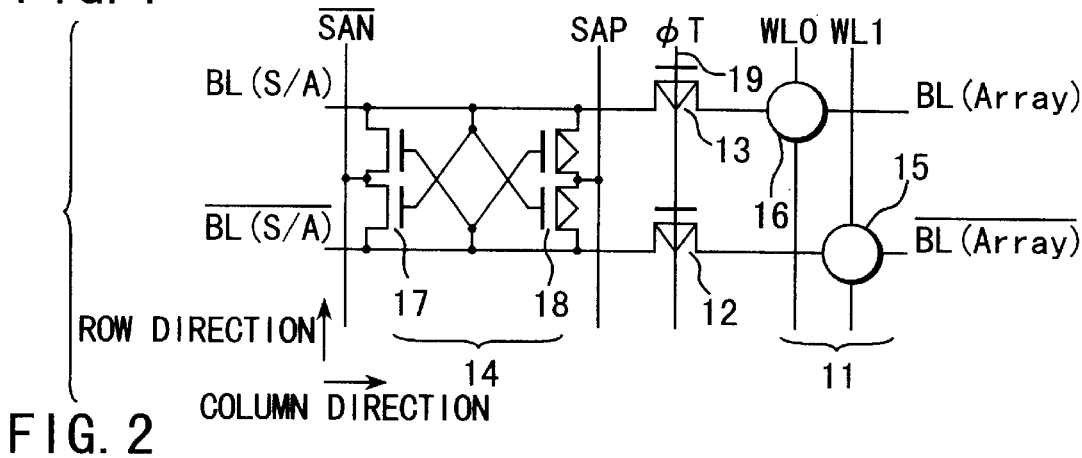
FIG. 2 is a diagram showing an equivalent circuit of a sense amplifier and a memory cell array of a semiconductor memory device according to a first embodiment.

FIG. 2 shows an equivalent circuit of the memory cell array portion and the sense amplifier portion in a DRAM according to a first embodiment of the present invention. Herein only the characteristic part from the configuration of FIG. 1 is presented for explaining the operation.

In the circuit configuration, a memory cell array portion 11 is connected to a sense amplifier portion 14 with a bit line pair BL, BL bar via P-type transfer gates 12, 13.

In the memory cell array portion 11, for example, a plurality of memory cells are arranged two-dimensionally. Word lines WL0, WL1 are connected to the memory cells 15, 16 as representatives thereof in the row direction. A bit line pair BL (array), BL (array) bar is connected in the column direction orthogonal thereto, with P-type transfer gates 12, 13 connected to one end thereof. The P-type transfer gates 12, 13 are driven by a control signal φT to be inputted to a transfer gate control line 19 later described. In embodiments described hereinafter, although the memory cell array portion comprises a plurality of memory cells, only a representative memory cell will be referred to in order to simplify the explanation.

The sense amplifier portion 14 comprises an N-type sense amplifier 17 comprising N-type transistor pair and a P-type sense amplifier 18 comprising a P-type transistor connected by cross-coupling. One of gates of each sense amplifier is connected to a bit line BL (S/A) and the other is connected to BL (S/A) bar. The N-type sense amplifier 17 is connected to an N-type sense amplifier driving line SAN bar in the row direction, and the P-type sense amplifier 18 is connected to a P-type sense amplifier connecting line SAP in the row direction.

When the sensing operation is conducted, and the voltages of the bit lines BL (S/A) and BL (S/A) bar in the sense amplifier portion are VBLH (bit-line voltage high) and VBLL (bit-line voltage low) in this configuration, since the bit lines BL (array) and BL (array) bar are connected to the bit lines BL (S/A) and BL (S/A) bar via the P-type transfer gates 12, 13, respectively, the voltage of BL (array) becomes VBLH (the same as the power source voltage Vcc), and the voltage of BL (array) bar becomes VBLL+|Vthp| owing to the so-called threshold value drop effect. Herein Vthp represents the threshold voltage of the P-type transistor comprising the transfer gate.

The sensing/restoring operation will be explained in detail with reference to the voltage wave form of the bit line of the memory cell array portion and the voltage wave form of the bit line of the sense amplifier portion in FIG. 3.

Figure 3:
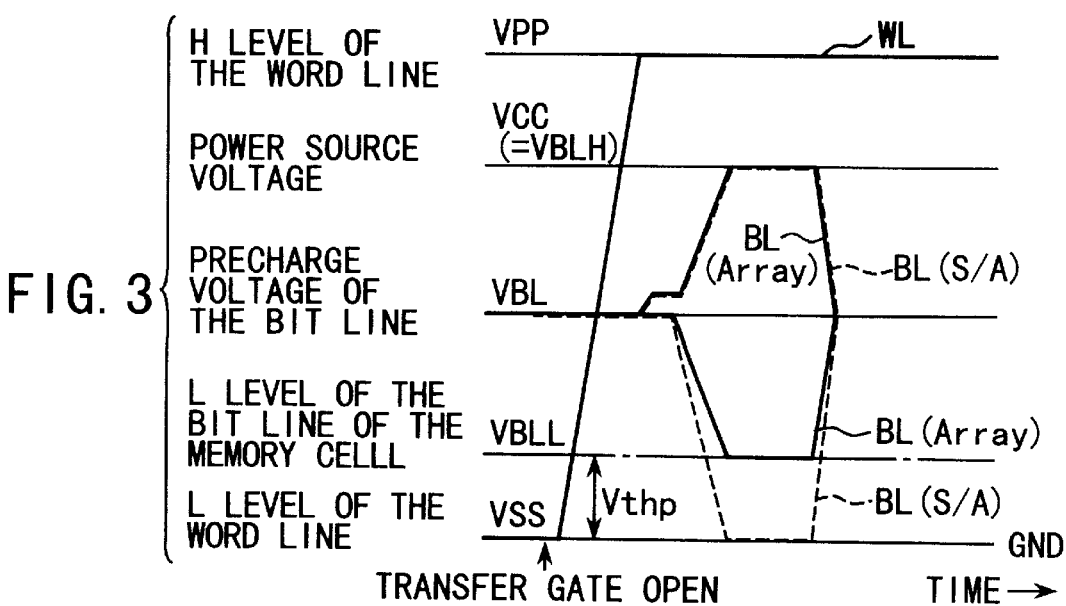
FIG. 3 is a diagram showing the voltage wave form of the bit line of the sense amplifier portion, the bit line and the word line of the memory cell array portion of the first embodiment.

The voltage levels shown in FIG. 3 represent the boosting voltage Vpp as the high level of the word line WL, the power source voltage Vcc, the precharge voltage of the bit line VBL, the GND voltage Vss, the bit line voltage of the low level of the memory cell array portion VBLL, the bit line voltage of the high level VBLH, and the threshold voltage of the transfer gate comprising the P-type transistor Vthp.

The voltage wave forms represent the voltage wave form of the word line WL, the voltage wave form of the bit line BL (array) of the memory cell array portion, the voltage wave form of the bit line BL (array) bar of the memory cell array portion, the voltage wave form of the bit line BL (array) bar of the memory cell array portion to be paired up with the above-mentioned bit line BL (array), the voltage wave form of the bit line BL (S/A) of the sense amplifier portion, and the voltage wave form of the bit line BL (S/A) bar to be paired up with the bit line BL (S/A).

In the initial state before implementing the sensing/restoring operation, that is, in the precharge period, the voltage of the bit lines (BL (array), BL (array), BL (S/A), BL (S/A) bar) to be connected to the memory cell array portion 11 and the sense amplifier portion 14, and the voltage of the sense amplifier driving lines (SAN bar, SAP) are precharged to the bit line precharge voltage VBL.

The voltage of the word lines WL0, WL1 are set to the GND voltage Vss, and the transfer gate control line 19 is inactivated.

The transfer gate control line 19 is activated first, then the voltage of the word lines WL0, WL1 is activated from Vss to Vpp so that information in the memory cells 15, 16 is transferred to the bit lines.

Thereafter, the voltage of the N-type sense amplifier driving line SAN bar is changed to Vss, the voltage of the P-type sense amplifier driving line SAP is changed to Vcc to initiate the sensing operation. Thereby, the voltage of the bit line of the sense amplifier portion is sensed to be Vss/Vcc. Herein, it is presumed that the voltage of the bit line BL (array) is sensed to be Vcc, and the voltage of the bit line BL (array) bar is sensed to be Vss.

At the time, the voltage of the bit lines BL (S/A), BL (S/A) bar of the sense amplifier portion 14 is transferred to the bit lines BL (array), BL (array) bar of the memory cell array portion 11 via the P-type transfer gates 12, 13. However, since the P-type transfer gates 12, 13 comprise P-type transistors, the voltage of the bit line BL (S/A) bar Vss is transferred to the bit line BL (array) as it is. The actual voltage of the bit line BL (array) bar is a voltage higher than Vss by the threshold voltage Vthp of the transfer gate. However, the voltage of Vcc of the bit line BL (S/A) is transferred to the bit line BL (array) as it is. Then the word line is activated to finish the sensing/restoring operation.

The writing operation of data is conducted as in the conventional DRAM by transferring the information to be written via a column selector while the sense amplifier is activated. In the sensing operation, the voltage difference to be applied between the gate and the source of the transistor comprising the N-type sense amplifier in a common Vcc/2 precharge type DRAM at the time of the operation is:

$$Vgs=VBL-VBLL.$$

In the present invention, it is:

$$Vgs=VBL-(VBLL-Vthp),$$

so that the voltage difference is generated for the threshold voltage of the P-type transistor of the transfer gate.

That is, since the voltage difference is generated between the memory cell array portion 11 and the sense amplifier portion 14 at the lower voltage side of the threshold voltage Vthp of the P-type transistor comprising the transfer gate 19, the voltage difference for the threshold voltage Vthp is always ensured even when the higher voltage (power source voltage Vcc) side becomes further lower so that a secure sensing/restoring operation can be achieved. Therefore, a power source voltage lower than a conventional power source voltage can be used.

Accordingly, the sensing operation can be conducted at a higher speed compared with conventional one, and the writing and reading operation can be achieved with a power source voltage lower than conventional one. The timing of activating the transfer gate control line is not necessarily immediately before activating the word line, but can be immediately before activating the sense amplifier driving line.

As heretofore mentioned, according to this embodiment, a large voltage amplitude of the bit line in the sense amplifier portion can be converted to a small voltage amplitude of the bit line in the memory cell array portion without adding a special circuit.

The P-type MOS transistors 12, 13, and the P-type sense amplifier 18 shown in FIG. 2 can be formed in the same well. Therefore, even if the P-type MOS transistors 12, 13 are added, the plane area will not be increased drastically.

In this embodiment, the control signal φT needs not be a boosted voltage since the threshold value rise is actively utilized, and thus an ordinary power source voltage can be used.

A second embodiment where a semiconductor memory device of the present invention is adopted in the shared sense amplifying method will be explained.

Figure 4:
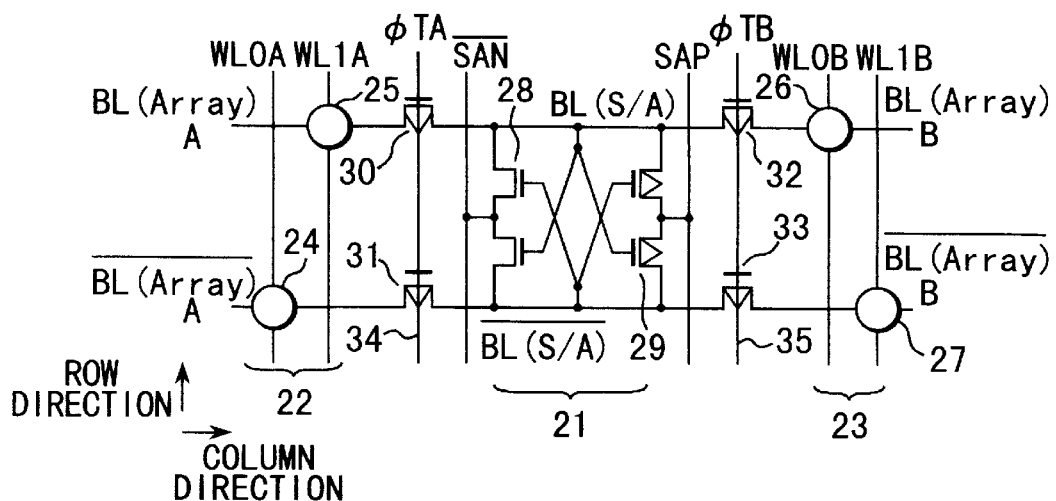
FIG. 4 is a diagram showing an equivalent circuit of a sense amplifier and a memory cell array of a semiconductor device of a second embodiment.

The same effect of an example of an equivalent circuit where one sense amplifier portion and one memory cell array portion are corresponded shown in FIG. 2 was explained in the above-mentioned first embodiment can be achieved in the shared sense amplifying method of this embodiment shown in FIG. 4.

The schematic equivalent circuit of the semiconductor memory device shown in FIG. 4 includes only a characteristic part. This is a configuration of the shared sense amplifying method with one sense amplifier portion 21 in the center shared by two memory cell array portions 22, 23.

In this configuration, a plurality of memory cells are arranged two-dimensionally in the memory cell array portion 22. For example, to the memory cells 24, 25, word lines WL0A, WL1A are connected in the row direction, and bit lines BL (array) A and BL (array) A bar are connected in the column direction.

Similarly, a plurality of memory cells are arranged in a matrix-like manner in the memory cell array portion 23. For example, to the memory cells 26, 27, the word lines WL0B, WL1B are connected in the row direction, and the bit lines BL (array) and BL (array) bar are connected in the column direction.

The sense amplifier portion 21 comprises the N-type sense amplifier 28 comprising an N-type transistor pair, and a P-type sense amplifier portion 29 comprising a P-type transistor, with one of gates of the transistor of each sense amplifier connected to the bit line BL (S/A), and the other connected to the bit line BL (S/A) bar. The N-type sense amplifier 28 is connected to the N-type sense amplifier driving line SAN bar in the row direction. The P-type sense amplifier 29 is connected to the P-type sense amplifier driving line SAP in the row direction. A bit line equalizer and a column selector are provided in the actual sense amplifier portion although they are not shown in the figure in order to simplify the figure.

One each end of the bit line pairs BL (S/A), BL (S/A) bar of the sense amplifier portion 21, and the bit lines BL (array) A, BL (array) A bar of the memory cell array portion 22 are connected via the P-type transfer gates 30, 31 comprising P-type transistors. Similarly, the other end of the bit line pairs BL (S/A), BL (S/A) bar and the bit lines BL (array) A, BL (array) A bar are connected via the P-type transfer gates 34, 35 comprising P-type transistors.

The P-type transfer gates 30, 31 are connected to the transfer gate control line 34, and driven by a control signal φTA to be inputted. Similarly, the P-type transfer gates 32, 33 are connected to the transfer gate control line 35, and driven by a control signal φTB to be inputted. A bit line equalizer and a column selector are provided in the actual sense amplifier portion 21 although they are not shown in the figure.

The sensing/restoring operation of the semiconductor memory device of the above-mentioned configuration is equivalent to the voltage wave form of the bit line of the memory cell array portion and the voltage wave form of the bit line of the sense amplifier portion shown in FIG. 3 so that the same effect can be achieved. Besides, since one sense amplifier portion is shared by two memory array portions, a high integration can be realized easily.

The P-type MOS transistors 30 to 33, and the P-type sense amplifier 29 shown in FIG. 4 can be formed in the same well. Therefore, even if the P-type MOS transistors 30 to 33 are added, the plane area will not be increased drastically.

In this embodiment, the control signal φT needs not be a boosted voltage since the threshold value rise is actively utilized, and thus an ordinary power source voltage can be used.

A third embodiment of a semiconductor memory device of the present invention will be explained.

Figure 5:
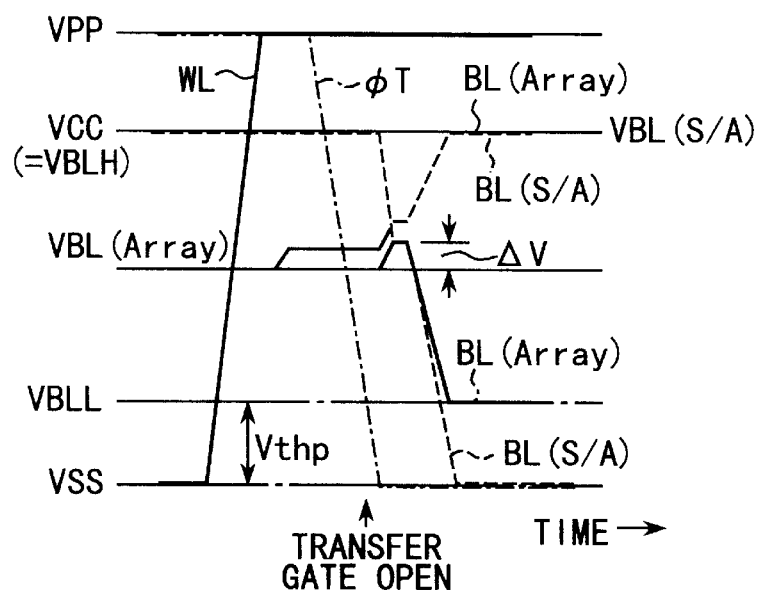
FIG. 5 is a diagram showing the voltage wave form of the bit line of the sense amplifier portion, the bit line and the word line of the memory cell array portion of the third embodiment.

This embodiment is an example with a configuration of FIG. 2, where the precharge voltages are different in the voltage wave form of the bit line of the memory cell array portion ad the voltage wave form of the bit line of the sense amplifier portion as shown in FIG. 5. Among signal levels and signal wave forms of FIG. 5, signals from the same portions as shown in FIG. 3 are applied with the same marks. Herein φT represents the voltage wave form of the transfer control line.

In this embodiment, in the precharge period before the sensing/restoring operation, the precharge voltage of the bit lines BL (array), BL (array) bar side to be connected to the memory cell array portion 11 is precharged to a Vcc voltage, which is higher than the precharge voltage of the bit lines BL (S/A), BL (S/A) bar side of the sense amplifier portion. The word lines WL0, WL1 are activated so that information is transferred from the memory cell to the bit line of the memory cell array portion, then the transfer gate control line 19 is activated.

In this embodiment, the available setting range of the precharge voltage VBL (S/A) for the bit lines BL (S/A), BL (S/A) bar of the sense amplifier portion 14 is:

VBL(array)≦VBL(S/A)≦Vcc.

By the setting, the voltage difference between the gate and the source of the transistor of the n-type sense amplifier can be increased compared with conventional one. In this embodiment, the case with the maximum voltage of the bit line VBL (S/A) shown in FIG. 5, that is, VBL (S/A)=Vcc is presented.

When the transfer gate control line 19 is activated in the precharge state with the precharge voltage difference of Vcc and VBL, the precharge voltage Vcc of the bit lines BL (S/A), BL (S/A) bar lowers, and the precharge voltage of the bit lines BL (/A), BL (S/A) bar rises as shown in FIG. 5. The voltage (ΔV) where the voltages coincide rises according to the capacity ratio of the bit line capacity of the bit line of the sense amplifier portion and the bit line of the memory cell array portion.

For example, with the premise that the bit line capacity of the sense amplifier portion is CB (S/A), the bit line capacity of the memory cell array portion is CB (array), the voltages of the bit lines of the memory cell array portion and the sense amplifier portion before activating the transfer gate control line 19 are V array, V S/A, respectively, the increased voltage can be sought for the bit line of the sense amplifier portion (ΔVSA) and for the bit line of the memory cell array portion (ΔVarray) by:

$$\Delta V_{SA} = \pm \frac{C_{B(Array)}}{C_{B(S/A)} + C_{B(Array)}} (V_{S/A} - V_{Array})$$

$$\Delta V_{Array} = \mp \frac{C_{B(S/A)}}{C_{B(S/A)} + C_{B(Array)}} (V_{S/A} - V_{Array})$$

Since the time to reach a certain voltage Vcc can be reduced by the increased voltage ΔV of the bit line voltage, a sensing operation can be achieved at a further high speed with respect to the above-mentioned embodiment. Since the voltage difference can be generated at the low voltage side between the memory cell array portion 11 and the sense amplifier portion 14 by the threshold voltage Vthp of the P-type transistor comprising the transfer gate 19, the voltage difference can always be ensured for the threshold voltage Vthp even if the higher voltage (power source voltage Vcc) side becomes lower so that a secure sensing/restoring operation can be enabled. Therefore, a lower power source voltage with respect to the conventional power source voltage can be used.

A fourth embodiment of a semiconductor memory device of the present invention will be explained.

Figure 6:
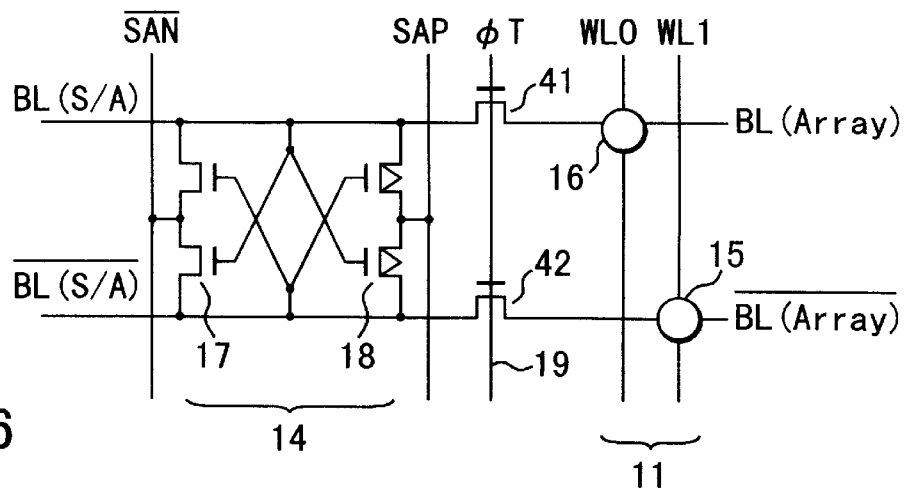
FIG. 6 is a diagram showing an equivalent circuit of a sense amplifier and a memory cell array of a semiconductor device of a fourth embodiment.
Figure 7:
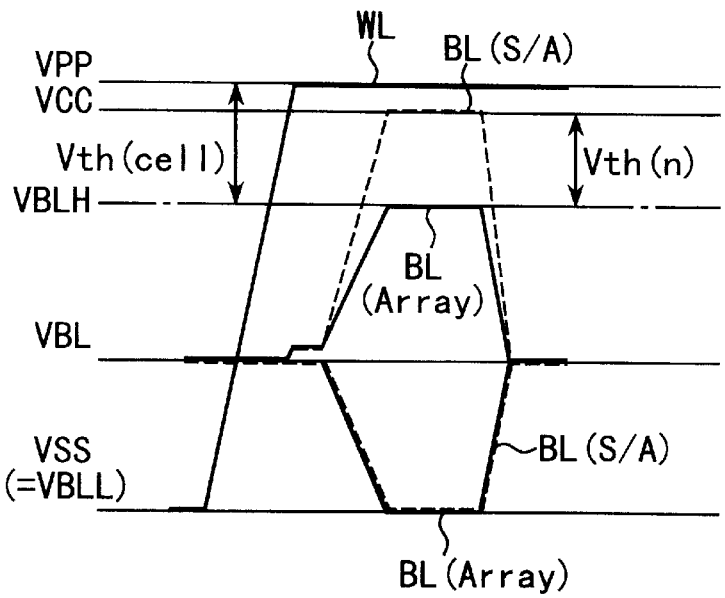
FIG. 7 is a diagram showing the voltage wave form of the bit line of the sense amplifier portion, the bit line and the word line of the memory cell array portion of the fourth embodiment.

FIG. 6 shows an equivalent circuit of a memory cell array portion and a sense amplifier portion in a semiconductor memory device of this embodiment. FIG. 7 shows the bit line voltage wave form at the time of the sensing/restoring operation in this configuration. In this configuration, portions the same as FIG. 2 are applied with the same marks, and further explanation is not given herein.

In the above-mentioned embodiments, the P-type transfer gate 19 comprising the P-type transistor is used, but this embodiment comprises N-type transfer gates 41, 42 comprising an N-type transistor.

In this configuration, voltage levels shown in FIG. 7 represent the boosting voltage Vpp as the high level of the word lines WL0, WL1, the power source voltage Vcc, the precharge voltage of the bit line VBL, the threshold voltage of the memory cell transistor Vth (cell), the threshold voltage of the N-type transfer gates 41, 42 comprising an n-type transistor Vthn, the maximum value VBHL and the minimum value VBLL (GND voltage Vss) of the voltage amplitude of the bit lines BL (array) bar, BL (array) of the memory cell array portion 11.

The voltage wave forms represent the voltage wave form of the word line WL, the voltage wave form of the bit line BL (array) of the memory cell array portion, the voltage wave form of the bit line BL (array) bar of the memory cell array portion, the voltage wave form of the bit line BL (array) bar of the memory cell array portion to be paired up with the above-mentioned bit line BL (array), the voltage wave form of the bit line BL (S/A) of the sense amplifier portion, and the voltage wave form of the bit line BL (S/A) bar to be paired up with the bit line BL (S/A).

The configuration and the reading/restoring operation of this embodiment are substantially the same as the first embodiment except that a conventional N-type transistor is used as the transfer gate.

In the sensing operation, as to the voltage difference to be applied between the gate and the source of the transistor comprising the P-type sense amplifier 18, in general, the voltage difference to be applied between the gate and the source of the transistor comprising the N-type sense amplifier 17 in a common Vcc/2 precharge type DRAM at the time of the operation is:

$$Vgs=VBL-VBLL.$$

In the present invention, it is:

$$Vgs=(VBLH+Vthn)-VBLL,$$

so that the voltage difference is generated for the threshold voltage Vthn of the N-type transistor of the transfer gate 19 at the high voltage side between the memory cell array portion 11 and the sense amplifier portion 14 compared with the conventional one so that a secure and high speed sensing operation can be enabled.

Besides, the operation can be conducted at a lower power source voltage compared with the conventional one. In addition to that, since the bit line voltage necessary for writing the "high" information to the memory cell is VBLH, which is lower than the conventional Vcc by Vthn, the boosting voltage of the word line can be lower than the conventional one by Vthn.

Therefore, reliability of the memory cell transistor can be improved, and a transistor with a high current driving ability can be used. Further, the threshold voltage of the transistor of the memory cell to further lower the active level of the word line voltage by having the inactive level of the voltage of the word line lower than Vss. Accordingly, the boosting voltage Vpp can be omitted.

I this embodiment is adopted to the DRAM with LOGIC, a common transistor can be used in the LOGIC portion and in the DRAM portion so that the production process can be simplified and shared to drastically reduce the production cost and the production time by simplifying the production process.

The timing of activating the transfer gate control line in this embodiment can be not necessarily immediately before activating the word line, but can be immediately before activating the sense amplifier driving line.

Although the equivalent circuit shown in FIG. 6 is presented as an example of this embodiment, the same effect can be achieved by adopting the N-type transfer gate in the shared sense amplifying method as shown in FIG. 4. A bit line equalizer and a column selector (not illustrated) are further provided in the sense amplifier portion 14.

The N-type MOS transistors 41, 42, and the N-type sense amplifier 17 shown in FIG. 6 can be formed in the same well. Therefore, the plane area will not be drastically increased even if the N-type MOS transistors 41, 42 are added.

In this embodiment, the control signal φT needs not be a boosted voltage since the threshold value rise is actively utilized, and thus an ordinary power source voltage can be used.

A fifth embodiment of a semiconductor memory device of the present invention will be explained.

The configuration of this embodiment is equivalent to the above-mentioned configuration shown in FIG. 6 except that the precharge voltages of the bit line of the memory cell array portion and the bit line of the sense amplifier portion are different, and the operations are different.

Figure 8:
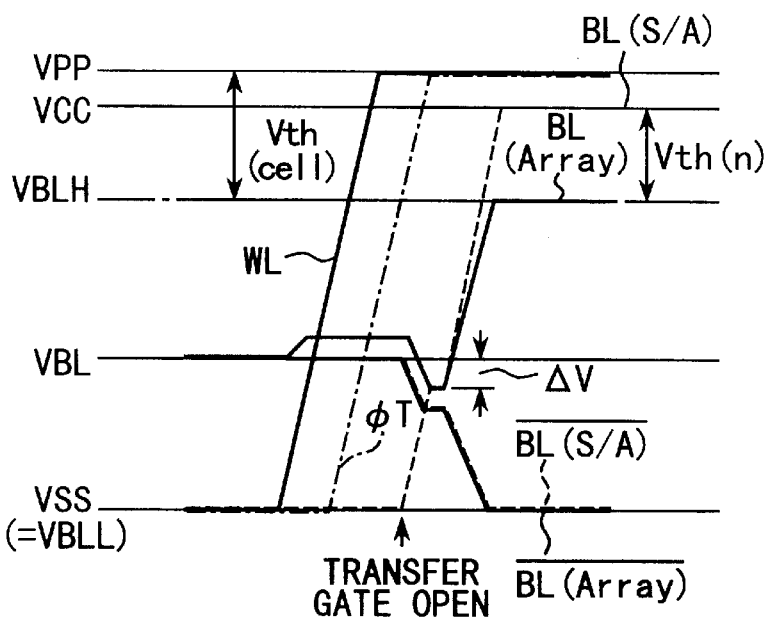
FIG. 8 is a diagram showing the voltage wave form of the bit line of the sense amplifier portion, the bit line and the word line of the memory cell array portion of the fifth embodiment.

The voltage wave forms shown in FIG. 8 include the voltage wave forms the bit lines BL (array), BL (array) bar of the memory cell array portion 11, the voltage wave forms of the bit lines BL (S/A), BL (S/A) bar of the sense amplifier portion 14, the voltage wave form of the word lines WL0, WL1, and the voltage wave form φT of the transfer gate control line 19.

As shown in FIG. 8, the precharge voltage of the bit lines BL (array), BL (array) bar is set at VBL, and the precharge voltage of the bit lines BL (S/A), BL (S/A) bar of the sense amplifier portion is set at VBLL (Vss). The precharge voltage VBL (S/A) of the bit line pair of the sense amplifier portion can be in the range of:

$$VBLL \leq VBL(S/A) \leq VBL(\text{array}).$$

This embodiment is an example with the VBL (S/A) set at the minimum value, that is, VBL (S/A)=Vss (VBLL).

The voltage of the word lines WL0, WL1 is activated from Vss to Vpp so that information is transferred from the memory cells 15, 16 to the bit lines BL (array), BL (array) bar of the memory cell array portion 11. Then, the voltage wave form φT of the transfer gate control line 19 is boosted from Vss to Vpp to activate the transfer gates 41, 42.

When the transfer gate control line 19 is activated, similarly as shown in FIG. 5, the time to reach a certain voltage Vss form a lowered voltage (ΔV) from the bit line voltage VBL can be reduced so that a sensing operation can be achieved at a speed further higher than the above-mentioned fifth embodiment.

In the precharge state with the voltage difference between the precharge voltages Vcc and VBL, by precharging the precharge voltage of the bit line pair of the sense amplifier portion in the precharge period at a voltage lower than the precharge voltage of the bit line pair of the memory cell array portion, the voltage difference between the gate and the source of the transistor of the P-type sense amplifier can be increased compared with the conventional one so that the effect the same as the above-mentioned embodiment can be achieved.

Although the configuration shown in FIG. 6 is presented as an example of this embodiment, the same effect can be achieved by adopting this in the shared sense amplifying method as shown in FIG. 4 by the same operation. A bit line equalizer and a column selector (not illustrated) are further provided in the actual sense amplifier portion.

A sixth embodiment of a semiconductor memory device of the present invention will be explained.

Figure 9:
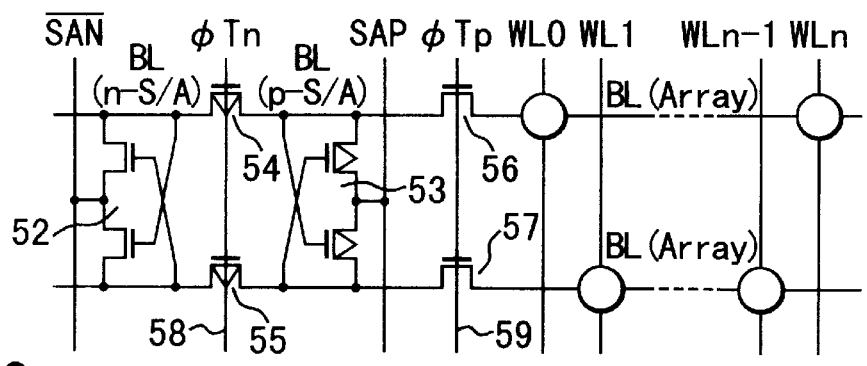
FIG. 9 is a diagram showing an equivalent circuit of a sense amplifier and a memory cell array of a semiconductor device of a sixth embodiment.
Figure 10:
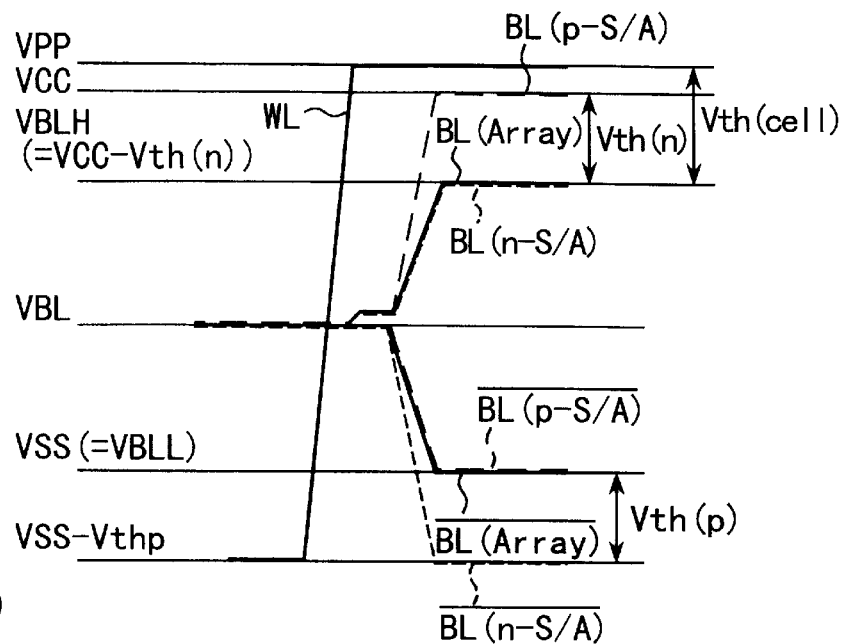
FIG. 10 is a diagram showing the voltage wave form of the bit line of the sense amplifier portion, the bit line and the word line of the memory cell array portion of the sixth embodiment.

FIG. 9 shows an equivalent circuit of the memory cell array portion and the sense amplifier portion of this embodiment. FIG. 10 shows the voltage wave form of the bit lines and the voltage wave form of the word lines in the operation of the equivalent circuit.

The semiconductor memory device shown in FIG. 9 comprises a memory cell array portion 51 where a plurality of memory cells are arranged two-dimensionally, and connected to the word lines WL0, ... WLn in the row direction, and to the bit lines BL (array), BL (array) bar in the column direction, an N-type sense amplifier 52 comprising an N-type transistor pair, P-type transfer gates 54, 55 comprising a P-type transistor for separating a P-type sense amplifier, to be connected to the N-type sense amplifier 52, a P-type sense amplifier 53 comprising a P-type transistor pair, and N-type transfer gates 56, 57 comprising an N-type transistor for separating a P-type sense amplifier, to be connected to the P-type sense amplifier 53.

In this configuration, the N-type sense amplifier 52 and the P-type sense amplifier 53 are arranged separately. Information is written or read by the N-type sense amplifier 52 through the P-type transfer gates 54, 55 and by the P-type sense amplifier 53 through the N-type transfer gates 56, 57. By having different voltage amplitudes of the bit line of the memory cell array portion 51 and the N-type and P-type sense amplifier portions 52, 53, the voltage difference between the gate and the source of the sense amplifier transistor can be enlarged to have a high speed sensing operation and an improved reliability. The P-type transfer gates 54, 55 and the N-type transfer gates 56, 57 can function by activating the transfer gate control lines 58, 59.

FIG. 10 shows the bit line voltage wave form at the time of the sensing/restoring operation in this embodiment. The signal levels shown in FIG. 10 represent the maximum value VBHL and the minimum value VBLL of the voltage amplitude of the bit lines BL (array), BL (array) bar of the memory cell array portion 51, the boosting voltage Vpp as the high level of the word line WL, the power source voltage Vcc, the precharge voltage of the bit line VBL, the bit line voltage of the low level of the memory cell array portion VBLL (Vss), the bit line voltage of the high level VBLH (Vcc−Vthn), the threshold voltage of the P-type transfer gate Vthp, and the threshold voltage of the N-type transistor Vthn.

The voltage wave forms represent the voltage wave form of the threshold voltage of the memory cell transistor Vth (cell), the threshold voltage of the N-type transistor Vthn, the bit lines BL (n-S/A), BL (n-S/A) bar of the N-type sense amplifier 52, the voltage wave form of the bit lines BL (p-S/A), BL (p-S/A) bar of the P-type sense amplifier 53, and the voltage wave form of the word line WL.

As shown in FIG. 10, by activating the transfer gate control line 58, the P-type transfer gates 54, 55 are driven so that the voltage of the bit line BL (n-S/A) bar becomes lower than the voltage of BL (array) bar by the threshold voltage Vthp. By activating the transfer gate control line 59, the N-type transfer gates 56, 57 are driven so that the voltage of the bit line BL (n-S/A) becomes higher than BL (array) by the threshold voltage Vthn.

According to the configuration, the advantages of both configurations of FIGS. 3 and 7 can be provided. The voltage can be higher by the threshold voltage Vthn or lower by the threshold voltage Vthp with respect to the bit line BL (array) or BL (array) bar so as to ensure the voltage difference to achieve a secure sensing/restoring operation. Therefore, a power source voltage lower than a conventional one can be used.

The timing of activating the transfer gate control line in this embodiment is not necessarily immediately before activating the word line, but can be immediately before activating the sense amplifier driving line.

Figure 11:
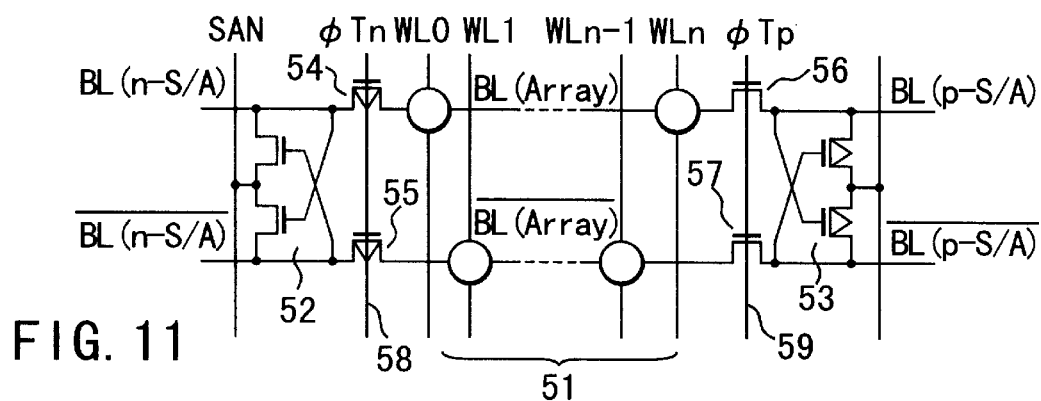
FIG. 11 is a diagram showing an equivalent circuit of a modified embodiment of the sixth embodiment.

This embodiment has been explained with the equivalent circuit shown in FIG. 9 as an example, but as shown in FIG. 11, the same operation can be achieved in an equivalent circuit where the memory cell array portion 51 is connected to the N-type sense amplifier 52 via the P-type transfer gates 54, 55, and to the P-type sense amplifier 53 via the N-type transfer gates 56, 57 on the other side. A bit line equalizer and a column selector are provided in the actual sense amplifier portion although they are not shown in FIGS. 9 and 11 in order to simplify the figures.

The type MOS transistors 54, 55, and the P-type sense amplifier 53 shown in FIGS. 9 and 11 can be formed in the same well. Therefore, even if the P-type MOS transistors 54, 55 are added, the plane area will not be increased drastically.

In this embodiment, the control signal $\phi T$ needs not be a boosted voltage since the threshold value rise is actively utilized, and thus an ordinary power source voltage can be used.

A seventh embodiment of a semiconductor memory device of the present invention will be explained.

This embodiment has a configuration equivalent to FIG. 9, with different precharge voltages for the bit line of the memory cell array portion comprising a combination of the third and fifth embodiments and the bit line of the sense amplifier portion.

Figure 12:
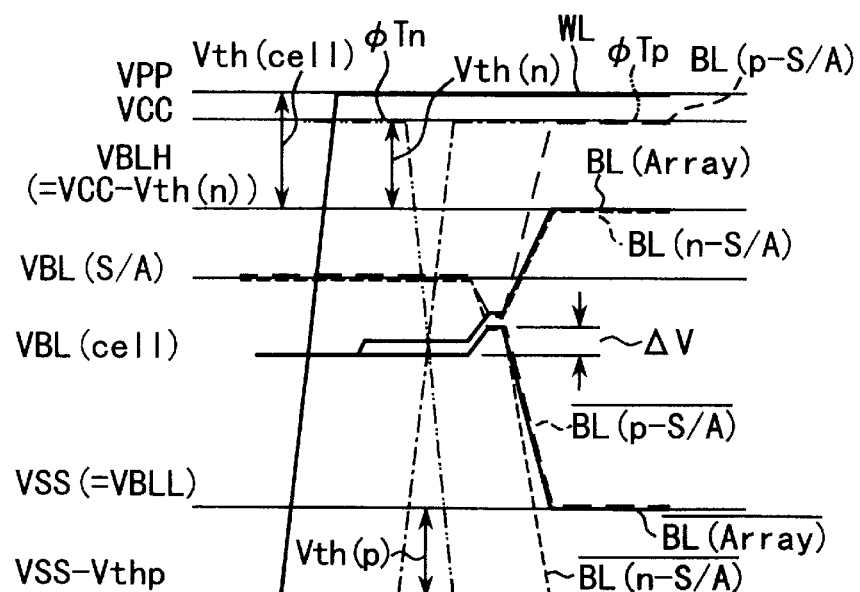
FIG. 12 is a diagram showing the voltage wave form of the bit line of the sense amplifier portion, the bit line and the word line of the memory cell array portion of the seventh embodiment.

FIG. 12 shows the voltage wave form of the bit line of the memory cell array portion and the voltage wave form of the bit line of the sense amplifier portion of this embodiment.

The signal levels shown in FIG. 12 are equivalent to the signal levels shown in FIG. 10. The voltage wave forms represent the voltage wave form of the threshold voltage of the memory cell transistor Vth (cell), the threshold voltage of the N-type transistor Vthn, the bit lines BL (n-S/A), BL (n-S/A) bar of the N-type sense amplifier 52, the voltage wave form of the bit lines BL (p-S/A), BL (p-S/A) bar of the P-type sense amplifier 53, the voltage wave form of the word line WL, the transfer gate control line $\phi Tp$ of the P-type transfer gates 54, 55, and the transfer gate control line $\phi Tn$ of the N-type transfer gates 56, 57.

In this embodiment, the precharge voltage of the bit lines BL (array), BL (array) bar of the memory cell array portion is set at VBL (cell), the precharge voltage of the bit lines BL (n-S/A), BL (n-S/A) bar, BL (p-S/A), BL (p-S/A) bar of the sense amplifier potion is set at a voltage VBL (S/A) higher than VBL (cell).

The precharge voltage VBL (S/A) of the bit line pair of the sense amplifier portion can be in the range of:

$$VBL(\text{array}) \leq VBL(S/A) \leq Vcc.$$

By setting at the precharge voltage, the same operation explained in the above-mentioned third and fifth embodiments can be achieved. The voltage difference between the gate and the source of the transistor of the N-type sense amplifier can be increased with respect to the conventional one. In general, since the P-type sense amplifier starts the operation after starting the operation of the N-type sense amplifier, by having a large voltage difference between the gate and the source of the sense amplifier transistor of the N-type sense amplifier, effects such as a high speed sensing operation, and improvement of the sense margin can be achieved.

In this embodiment, after transferring information from the memory cell to the bit line of the memory cell array portion by activating the word line, the transfer gate control line is activated.

An eighth embodiment of a semiconductor memory device of the present invention will be explained.

Figure 13:
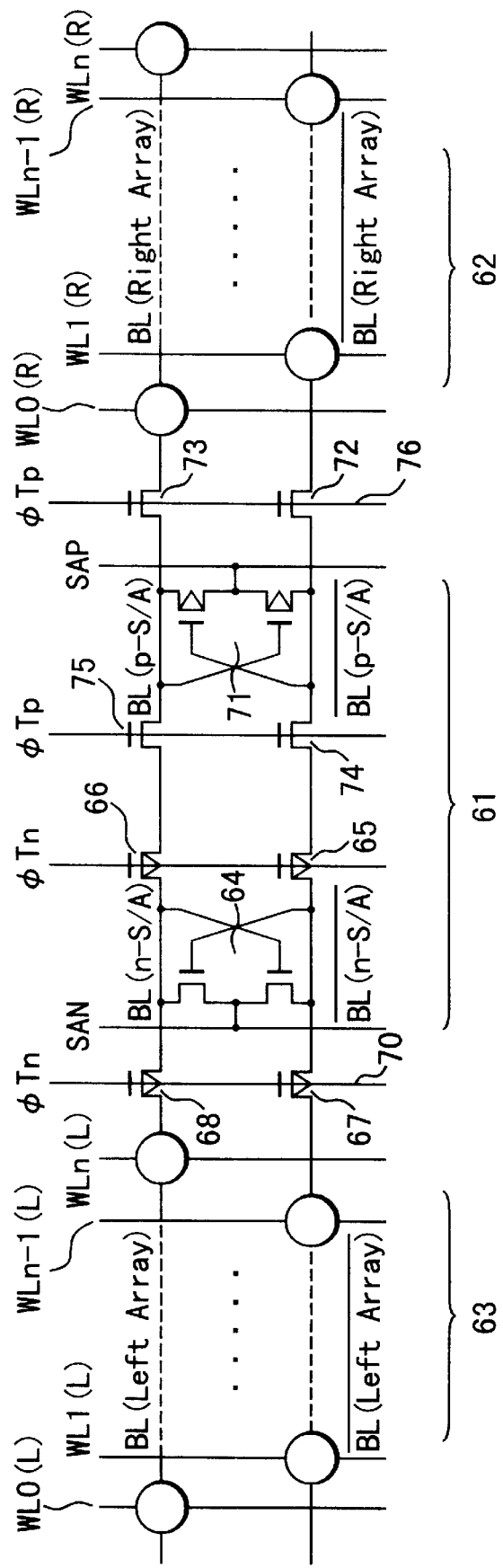
FIG. 13 is a diagram showing an equivalent circuit of a sense amplifier and a memory cell array of a semiconductor device of an eighth embodiment.

FIG. 13 shows an equivalent circuit of this embodiment adopted in the so-called shared sense amplifying method where one set of a sense amplifier portion 61 is shared by two memory cell array portions 62, 63.

This embodiment has a configuration combining the above-mentioned second and sixth embodiments. The operation the same as the configuration shown in FIG. 10 is conducted in memory cell array portions.

In this configuration, a plurality of memory cells are arranged two-dimensionally in the two memory cell array portions 62, 63. To the memory cells, word lines WL0(R), . . . , WLn(R) are connected in the row direction, and the bit lines BL (array) and BL (array) bar are connected in the column direction.

In the sense amplifier portion 61, the P-type transfer gates 65, 66, 67, 68 comprising a P-type transistor are provided at both ends of the bit lines BL (n-S/A), BL (n-S/A) bar of the N-type sense amplifier 64 comprising an N-type transistor pair, and the transfer gate control lines (φTp) 69, (φTp) 70 are connected. The N-type transfer gates 72, 73, 74, 75 comprising a P-type transistor are provided at both ends of the bit lines BL (p-S/A), BL (p-S/A) bar of the P-type sense amplifier 71 comprising a P-type transistor pair, and the transfer gate control lines (φTn) 76, (φTn) 77 are connected. A bit line equalizer and a column selector (not illustrated) are provided in the actual sense amplifier portion 61.

According to the configuration, the voltage difference is generated between the memory cell array portions and the sense amplifier portion by the threshold voltages Vthn, Vthp of the transistor shown in FIG. 3 so that a secure sensing/restoring operation can be achieved. Since one sense amplifier portion is shared by two memory cell array portions, a high integration can be achieved easily.

The P-type MOS transistors 65 to 68, and the P-type sense amplifier 71 shown in FIG. 13 can be formed in the same well. Therefore, even if the P-type MOS transistors 65 to 68 are added, the plane area will not be increased drastically.

In this embodiment, the control signals φTp, φTn need not be a boosted voltage since the threshold value rise is actively utilized, and thus an ordinary power source voltage can be used.

A ninth embodiment of a semiconductor memory device of the present invention will be explained with reference to FIG. 14.

In the above-mentioned first embodiment, as shown in FIG. 2, the P-type transfer gate comprising the P-type transistor is inserted between the memory cell portion and the sense amplifier portion so that a sufficient operation margin of the sense amplifier can be ensured utilizing the threshold value drop of the P-type transfer gate, and the reliability of the fine elements can be improve by having a low voltage of the word line driving voltage. As a result, an extremely high performance DRAM can be realized.

However, in the actual production, by the influence of the fluctuation of the production process in the semiconductor production process, and the like, the threshold voltage of the P-type transfer gate and the memory cell transistor becomes irregular so that the production cannot be conducted according to a certain regularity.

When the irregularity is generated, the low level side voltage (VBLL) of the bit line BL (array) bar of the memory cell portion fluctuates per the memory cell so that the data retention characteristic of the semiconductor memory device can be deteriorated. For example, when the absolute value |Vth−φT| of the threshold voltage of the P-type transfer gate 13 shown in FIG. 2 moves to the lower side with respect to the set value, VBLL approaches to Vss (GND). Accordingly, since the set value when the word line WL is inactivated is Vss, the voltage between the gate and the source of the memory cell transistor becomes higher than the set value to deteriorate the cut off characteristic of the memory cell transistor, and data are leaked to lower the cell data retention characteristic.

Further, even when the threshold voltage of the memory cell transistor Vth (cell) is lowered, since VBL1 is constant, the cut off characteristic of the memory cell transistor is deteriorated so that the cell data retention characteristic may be lowered.

In this embodiment, a constant voltage generating circuit is provided for correcting a direct current voltage activating the P-type transfer gate in a self aligning manner for detecting the fluctuation of the threshold voltage of the threshold voltage of the P-type transfer gate and the memory cell transistor, and activating the P-type transfer gate.

In the configuration of this embodiment, two memory cell array portions 82, 83 share one sense amplifier portion 81. The memory cell array portion 82 is connected to the sense amplifier portion 81 via the P-type transfer gates 84, 85 comprising a P-type transistor. Similarly, the memory cell array portion 83 is connected to the sense amplifier portion 81 via the P-type transfer gates 86, 87. A bit line equalizer portion 88 and a column selector portion 89 are further provided between the P-type transfer gates 84, 85 and the sense amplifier 81.

To the transfer gate control line (φTn) 90 to be connected to the gate electrode of the P-type transfer gates 84, 85, a P-type transfer gate driving circuit 92 comprising an N-type transistor and a P-type transistor pair is provided for supplying a driving voltage of the certain direct current voltage later described. Similarly, to the transfer gate control line (φTp) 91 to be connected to the gate electrode of the P-type transfer gates 86, 87, a P-type transfer gate driving circuit 93 having the same configuration as the P-type transfer gate driving circuit 92 is provided. Further, to the P-type transfer gate driving circuits 92, 93, a P-type transfer gate driving constant voltage generating circuit 94 for supplying a signal VISO to be the standard of the driving voltage to be outputted is provided. The signal VISO is a signal to fluctuate following the threshold value fluctuation if the P-type transfer gate and the cell transistor in a self aligning manner.

To the memory cell array portion 82, the word lines WL0(R), WL1(R) are connected in the row direction, and the bit line pair BL (Rarray), BL (Rarray) bar are connected in the column direction. To the memory cell array portion 83, the word lines WL0(L), WL1(L), and the bit lines BL (Larray), BL (Larray) bar are connected similarly.

The sense amplifier portion 81 comprises a P-type sense amplifier comprising a P-type transistor pair, and an N-type sense amplifier comprising an N-type transistor pair. To the bit line pair BL(p-S/A), BL (p-S/A) bar of the P-type sense amplifier, the P-type transfer gates 84, 85 are connected. And to the bit line pair BL (n-S/A), BL (n-S/A) bar of the N-type sense amplifier, the P-type transfer gates 86, 87 are connected.

The column selecting gate 88 is connected to the DQ line pair (DQ, DQ bar) so as to externally output data of the bit line pair selected by the column address. The bit line equalize circuit 89 is connected to the VBL wiring so as to precharge the bit line pair to the ½ voltage (VBL) of the bit line amplitude.

To the P-type transfer gates 84, 85, 86, 87, a driving signal from the P-type transfer gate driving circuits 92, 93 is applied. During the RAS bar precharge period, the gate electrode input signal of the P-type transfer gate is maintained at a low level. On the other hand, during the active RAS bar period, by changing only the opposite side of the active memory cell array to a high level, either of the right and left memory cell arrays is selectively connected to the sense amplifier system. The driving voltage of the P-type transfer gate 81 is determined by the power source voltage (Vcc) and the VISO* signal outputted by the P-type transfer gate driving voltage generating circuit 94.

The semiconductor memory device of this configuration will be explained with reference to the timing chart of FIG.

15 showing the bit line voltage wave form and the timing in the sensing/restoring operation.

When the RAS bar changes from the H level to the L level to be in the RAS active state, the bit line equalize control signal EQL becomes the L level. The bit line is in the floating state and the signal φTR of the P-type transfer gates 84, 87 at the opposite side with respect to the active memory cell array portion becomes the H level so that the memory cell array portion 82 is cut off from the sense amplifier system circuit.

The word line WL0 selected by the external address is started so that the data retained in the memory cell array portion 83 are read out to the bit lines BL (Larray), BL (Larray) bar.

Subsequent to the activation of the word line WL0, the sense amplifier activating signals SAN bar, SAP are driven to start the sensing operation.

At the time, the bit line connected to the sense amplifier 81 is driven to the power source voltage and the ground voltage, but due to the P-type transfer gate threshold value drop of the bit line connected with the memory cell, the low level is limited to:

$$VISO*+|Vth\text{-}ISO|.$$

Vth-ISO represents the threshold voltage of the P-type transfer gate. At the time, the P-type transfer gate driving constant voltage generating circuit 94 follows the threshold value fluctuation of the P-type transfer gate and the cell transistor so as to fluctuate the output voltage VISO* in a self aligning manner.

RAS moves to the H level again to be in the RAS precharge state so that the word line returns to the non-selected state.

Thereafter, EQL, which is an equalize control signal moves to "H", and the gate signal φTR of the inactive P-type transfer gates 84, 85 moves to the L level to finish the operation.

Figure 14:
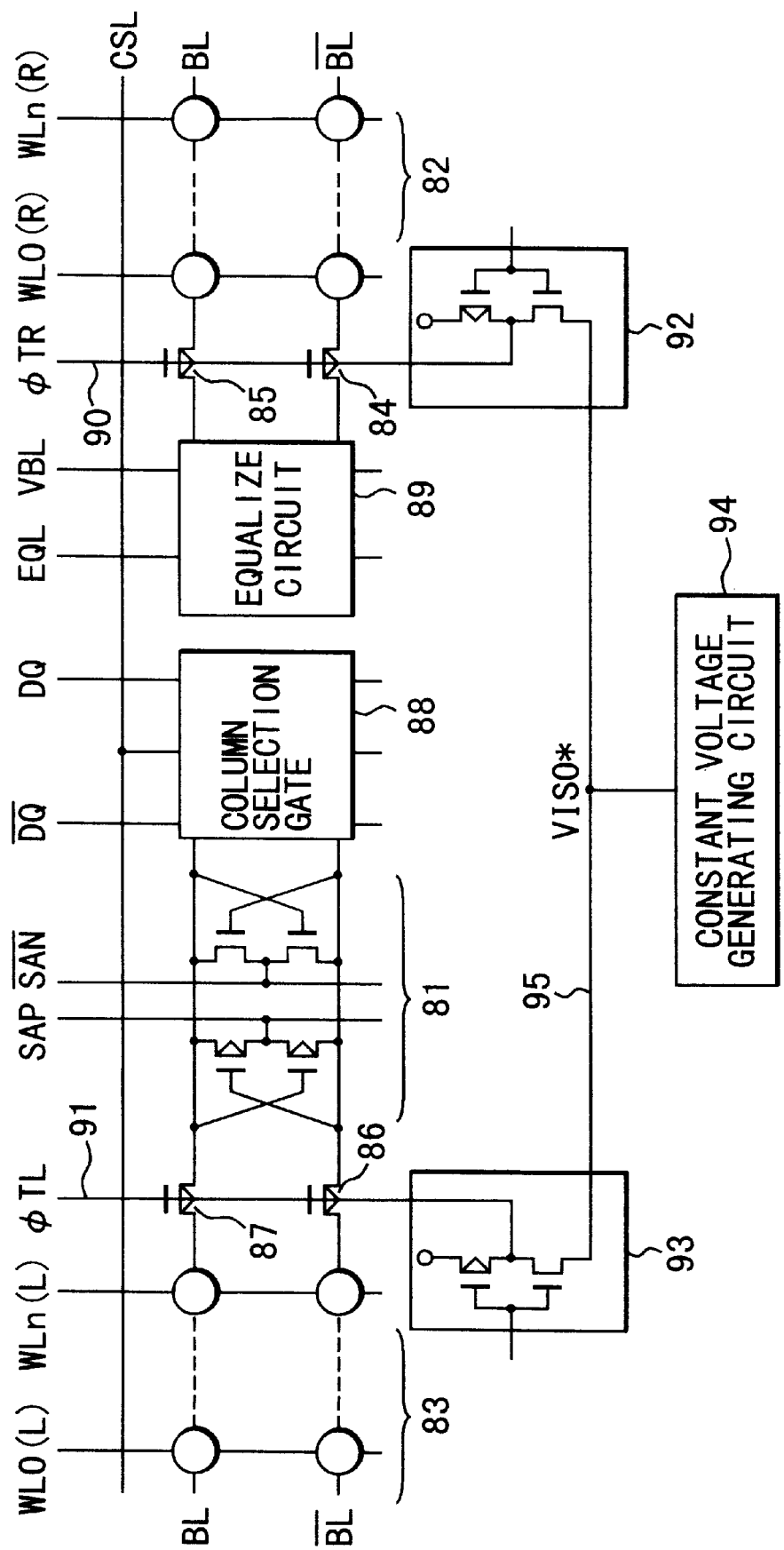
FIG. 14 is a diagram showing an equivalent circuit of a sense amplifier and a memory cell array of a semiconductor device of a ninth embodiment.
Figure 15:
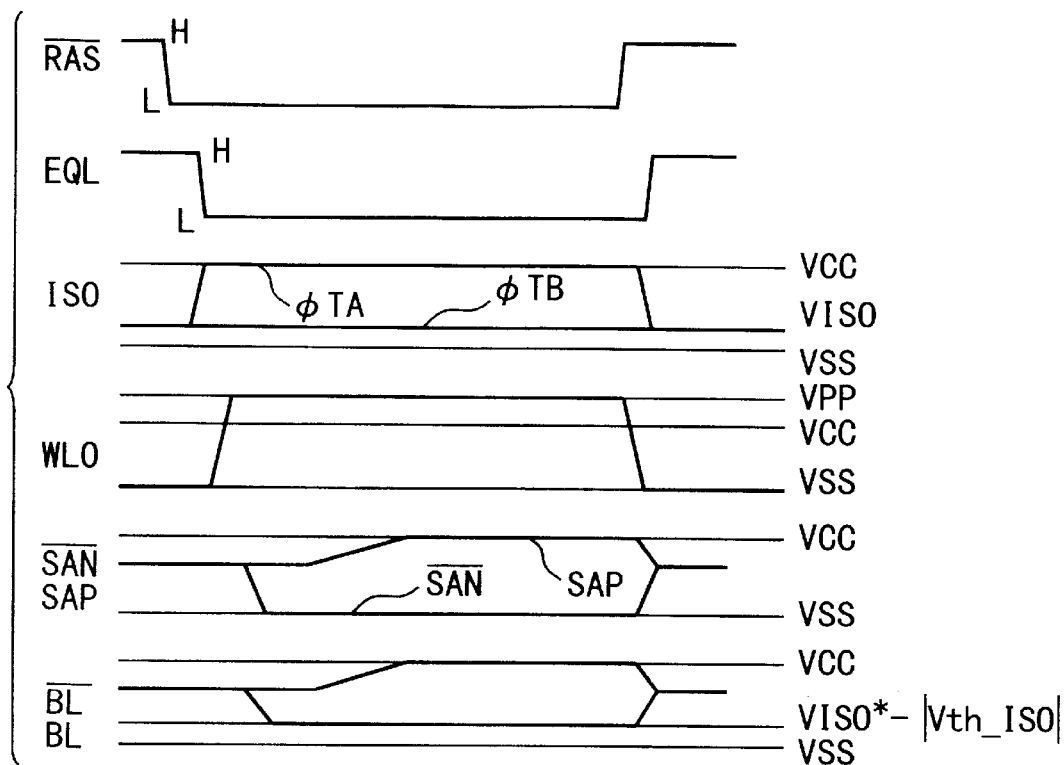
FIG. 15 is a timing chart for explaining the operation of the semiconductor memory device of the ninth embodiment.

The P-type MOS transistors 84 to 87 and the P-type sense amplifier shown in FIG. 14 can be formed in the same well. Therefore, even if the P-type MOS transistors 84 to 87 are added, the plane area will not be increased drastically.

In this embodiment, the control signals φTL, φTR need not be a boosted voltage since the threshold value rise is actively utilized, and thus an ordinary power source voltage can be used.

A configuration of the above-mentioned P-type transfer gate driving constant voltage generating circuit 94 mentioned above shown in FIG. 16 will be explained.

The P-type transfer gate driving constant voltage generating circuit 94 comprises a threshold value fluctuation compensating circuit 95 for compensating the threshold value fluctuation of the P-type transfer gate and the transistor of the memory cell, and a current booster circuit 96 for improved the current supply ability of the output signal (VISO) from the threshold value fluctuation compensating circuit 95.

According to the configuration, a preliminarily set standard voltage signal V(VREF) is inputted to the threshold value fluctuation compensating circuit 95 to output the output signal VISO. The output signal VISO is inputted to the current booster circuit 96 to become a large current, and supplied to the P-type transfer gates 84, 85, 86, 87 as a driving constant voltage signal (VISO*).

Concerning the improvement of the current supply ability of the current booster circuit 96 to the output signal VISO, since a comparatively large load current having the capacitance of the P-type transfer gate of the P-type transfer gate driving circuits 92, 93 as the main component flows in the signal line 95 for connecting the P-type transfer gate driving circuits 92, 93 and the P-type transfer gate driving constant voltage generating circuit 94, it is necessary to having a smaller internal impedance of the P-type transfer gate driving constant voltage generating circuit for stabilizing the driving constant voltage signal to be the output signal.

Figure 16:
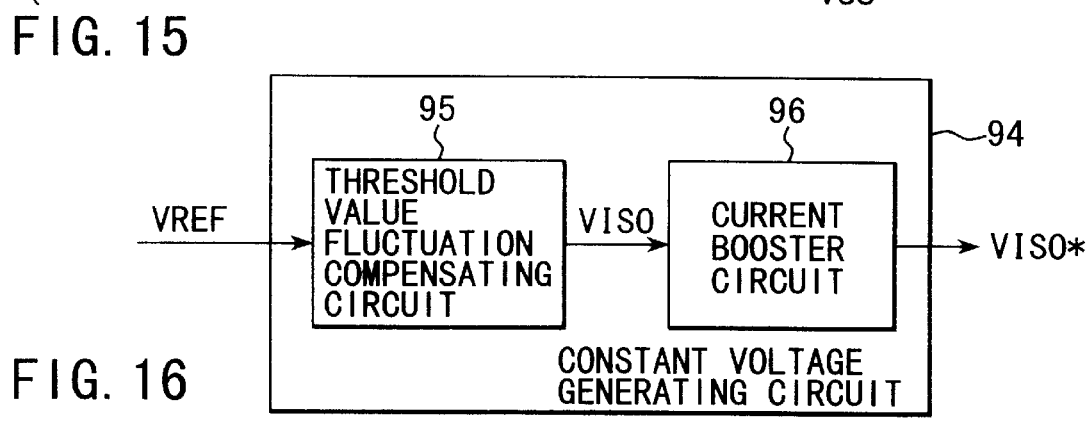
FIG. 16 is a block diagram showing a configuration of a constant voltage generating circuit for driving a P-type transfer gate shown in FIG. 15.
Figure 17:
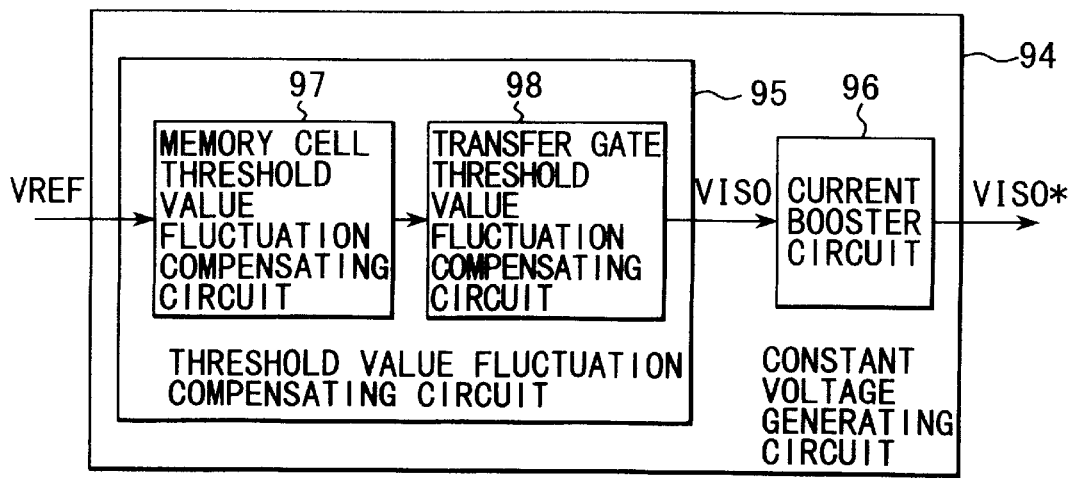
FIG. 17 is a block diagram showing a configuration of a threshold value fluctuation compensating circuit shown in FIG. 16.

FIG. 17 shows a configuration of the threshold value fluctuation compensating circuit 95 shown in FIG. 16.

The threshold value fluctuation compensating circuit 95 comprises two threshold value fluctuation compensating circuits 97, 98 for compensating the threshold value of the memory cell transistor (Vth (cell)) and the threshold value of the P-type transfer gate (Vth-ISO). As to the compensation order, compensation can be started from either of the threshold value values.

Figure 18:
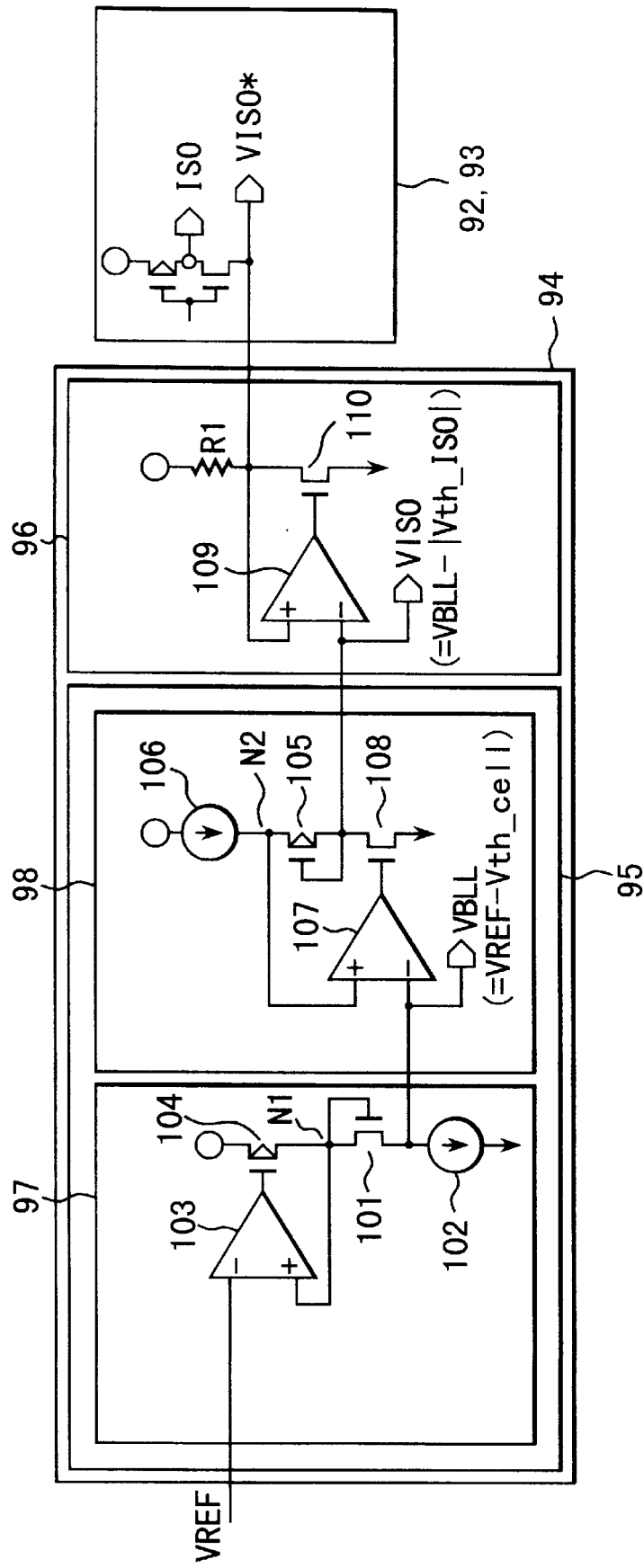
FIG. 18 is a diagram showing a concrete configuration of the constant voltage generating circuit for driving the P-type transfer gate shown in FIG. 15.

FIG. 18 shows a concrete configuration of the above-mentioned P-type transfer gate driving constant voltage generating circuit 94 and the P-type transfer gate driving circuits 92, 93.

The P-type transfer gate driving constant voltage generating circuit 94 comprises the threshold value fluctuation compensating circuit including a memory cell threshold value fluctuation compensating circuit 97 for compensating the fluctuation of the threshold value of the memory cell transistor (Vth (cell)) and a transfer gate threshold value fluctuation compensating circuit 98 for compensating the fluctuation of the threshold value fluctuation of the P-type transfer gate, and the current booster circuit 96, and is connected such that the output voltage (VISO*) thereof is inputted to the source electrode of the transistors of the P-type transfer gate driving circuits 92, 93.

The memory cell threshold value fluctuation compensating circuit 97 is produced with the same circuit size and the same process condition with respect to the transistor of the memory cell to be compensated. It comprises a monitoring transistor 101 to be connected to a node N1 by a diode connection, a constant current circuit 102 for obtaining the threshold voltage of the monitor transistor, a differential amplifier 103 for feeding back and comparing the inputted standard voltage VREF and the output signal, and a driver transistor 104 to be driven by the output signal from the differential amplifier 103.

The transfer gate threshold value fluctuation compensating circuit 98 is produced with the same circuit size and the same process condition with respect to the transistor of the transfer gate to be compensated. It comprises a monitoring transistor 105 to be connected to a node N2 by a diode connection, a constant current circuit 106 for obtaining the threshold voltage of the monitor transistor, a differential amplifier 107 for comparing the inputted standard voltage VBLL and the output signal of the constant voltage circuit 106, and a driver transistor 108 to be driven by the output signal from the differential amplifier 107.

The current booster circuit has a common circuit configuration comprising a differential amplifier 109, a driver transistor 110, and a return register R1. The output voltage thereof VISO* has a voltage the same as VISO, but a signal with an improved current supply ability can be outputted.

The operation of the P-type transfer gate driving constant voltage generating circuit 94 with the configuration will be explained.

In the memory cell threshold value fluctuation compensating circuit 97, the differential amplifier 103 controls the gate voltage of the driver transistor 104 based on the input standard voltage VREF such that the voltage of the node N1 shown in the figure becomes VREF.

The output voltage (VBLL) outputted from the transistor 101 becomes:

$$VBLL = VREF - Vth\text{-cell}.$$

Here Vth-cell corresponds to the threshold voltage of the cell transistor when a current determined by the constant voltage circuit 102 is supplied. In other words, it is necessary to appropriately set the current value supplied from the constant current circuit 102 for determining Vth-cell. As VBLL shown by the above-mentioned formula, the output voltage VBLL outputted from the memory cell threshold value fluctuation compensating circuit 97 fluctuates with respect to the fluctuation of Vth-cell in a self aligning manner.

By determining VREF as the input signal such that the VBLL corresponds to a typical value of the low level voltage of the bit line at the memory cell side, the threshold value fluctuation of the memory cell transistor can be compensated.

For example, when Vth-cell moves to the low voltage side, the voltage VBLL to be outputted becomes high so that the cut off characteristic of the memory cell transistor in a waiting state can be improved.

On the other hand, the threshold value fluctuation compensating circuit 98 of the P-type transfer gate controls the gate electrode of the driver transistor 105 such that the voltage VBLL outputted from the memory cell threshold value fluctuation compensating circuit 97 in the former stage is inputted and the differential amplifier 107 has a voltage the same as VBLL in the node N2.

Therefore, the output voltage of the driver transistor 105 connected to the constant current source 106 and monitored by the P-type transfer gate Vth becomes:

$$VISO = VBLL - |Vth\text{-ISO}|.$$

Also in this case, |Vth-ISO| corresponds with the threshold voltage of the P-type transfer gate transistor when a current value determined by the constant current source 106 flows, and the VISO voltage fluctuates following the fluctuation of this value in a self aligning manner.

For example, if the absolute value of the threshold voltage of the P-type transfer gate becomes small, VISO becomes higher in a self aligning manner. As a consequence, it functions such that the voltage of the cell side bit line is maintained constantly.

Accordingly, by providing compensating circuits accommodating threshold value fluctuation monitoring transistors produced in the circuit size and the production process condition the same as two transistors to be compensated are formed independently, and connecting the same serially, a highly accurate threshold value fluctuation compensation circuit where a generated output voltage can be compensated according to the threshold value fluctuation in a self aligning manner can be realized.

The output of the threshold value fluctuation compensating circuit 95 is inputted to the subsequent current booster circuit 96. By the current booster circuit 96, an output voltage VISO* having a voltage the same as the inputted VISO and an improved current supply ability can be outputted to the P-type transfer gate.

Since a lower output impedance of the above-mentioned output voltage VISO* contributes to the stabilization of the P-type transfer gate driving constant voltage generating circuit 94, in general, the driver transistor 110 comprises a transistor having a comparatively large gate width.

According to the P-type transfer gate driving constant voltage generating circuit 94 of the configuration, compensation can be conducted in a self aligning manner with respect to the threshold value fluctuation of the memory cell transistor and the threshold value fluctuation of the P-type transfer gate, and a stable constant voltage output signal with a small output impedance can be obtained. As a consequence, a high performance DRAM, not deteriorating the data retention characteristic of the memory cell can be realized.

As heretofore mentioned in detail, in this embodiment, by having the bit line amplitude of the sense amplifier portion larger than the bit line amplitude of the memory cell array portion, and further, by having different voltages for the precharge voltage of the bit line of the sense amplifier portion and the precharge voltage of the bit line of the memory cell array portion, a high speed sensing operation and an enlarged sense margin can be realized. Furthermore, with respect to the movement to low power source and voltage expected in the future, a secure sensing operation can be achieved with a power source and voltage lower than the conventional one.

By the configuration where the bit line of the memory cell array portion and the bit line of the sense amplifier portion are connected via the P-type transfer gate, a large bit line amplitude of the sense amplifier portion can be converted to a small bit line amplitude of the memory cell array portion without adding a special circuit but slightly changing the conventional configuration.

By having the P-type sense amplifier and the N-type sense amplifier arranged separately to the N-type transfer gate and the P-type transfer gate, a large bit line amplitude of the sense amplifier portion can be converted to a small bit line amplitude of the memory cell array portion without adding a special circuit.

In a core circuit where the transfer gate of PMOS is inserted between the bit line to be connected with the memory cell and the bit line to be connected with the sense amplifier, and the threshold value drop of the PMOS transistor is utilized so that the low level voltage of the memory cell side bit line is higher than the low level voltage of the sense amplifier side bit line, the threshold voltage fluctuation of the P-type transfer gate and the memory cell transistor is detected, and the voltage of the low level side of the driving voltage of the P-type transfer gate is compensated in a self aligning manner. Further, as to the fluctuation of the threshold voltage of the P-type transfer gate and the memory cell transistor, deterioration of the data retention characteristic of the memory cell can be avoided, and consequently, a high performance DRAM operated with a low voltage can be realized.

The present invention is not limited to the above-mentioned embodiments, but can be implemented with modification without departing from the essence thereof.

Although this embodiment has been explained mainly with DRAM, the present invention can be adopted in other types of memories, such as a PROM with a configuration where a PMOS transfer gate is inserted between the bit line to be connected to the bit line sense amplifier for detecting and amplifying memory cell information and the bit line to be connected to the memory cell so as to utilize the threshold value drop (Vth drop) of the gate.

Figure 19:
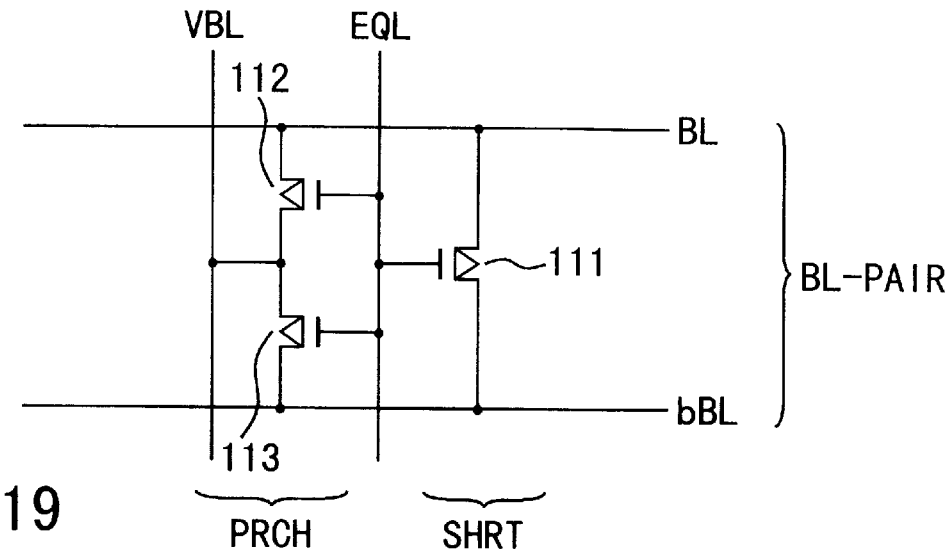
FIG. 19 is a diagram showing a configuration of a bit line equalize circuit of a tenth embodiment.

FIG. 19 shows an equivalent circuit of the bit line equalize circuit of a semiconductor memory device of a tenth embodiment of the present invention, with the bit line equalize circuit comprising a P-type transistor.

This embodiment comprises an equalize circuit SHRT comprising a P-type transistor 111, and a precharge circuit PRCH comprising P-type transistors 112, 113. Among the signal lines, "BL" represents the bit line, "bBL" represents the bit line to be paired up with BL, "BL-pair" represents the bit line pair, "EQL" represents the bit line equalizer control signal line, and "VBL" represents the precharge voltage supply line.

In the P-type transistor 111 of the equalize circuit SHRT, the drain electrode is connected to BL, the source electrode is connected to bBL, and the gate electrode is connected to EQL. The drain electrode of the P-type transistors 112 and 113 comprising the precharge circuit PRCH is connected to the bit line pairs BL and bBL, and the source electrode thereof is connected to VBL.

The operation of the bit line equalize circuit of this embodiment will be explained.

When the voltage of the bit line equalizer control signal line EQL is at the high level (in general, Vcc), the bit line equalize circuit is in the inactive state.

After writing or rewriting information in the memory cell, the voltage of EQL is changed to be in the low level (in general, Vss), and the bit line equalize circuit is activated. With the premise that the voltage of the bit line BL is Vcc, and the voltage of bBL is Vss immediately before activating the bit line equalize circuit, since the bit line pair BL and bBL is short circuited by the P-type transistor 111, ideally the voltage of the bit line pair BL and bBL is (Vcc+Vss)/2, respectively.

This is equal to Vcc/2, which is the general precharge voltage. In the case where the voltage of the bit line pair BL and bBL is not Vcc and Vss, or in the case where the capacities o the bit line pair B1 and bBL are different due to the irregularity of the production process, and the like, since the voltage of the bit line pair BL and bBL cannot be the precharge voltage only by the P-type transistor 111, the voltage of the bit line pair BL and bBL is set to be the precharge voltage by the precharging transistors 112 and 113.

The same is applied to the case where the precharge voltage is not Vcc/2. After finishing the bit line equalization, the voltage of EQL is returned to the high level. In addition to that, since the precharge circuit PRCH of this embodiment comprises the P-type transistor, the transistors 112, 113 serve also as a current limiting circuit.

All the precharge circuits PRCH in this embodiment comprise a P-type transistor. Therefore, since the current limiting circuit is not necessary between the precharge voltage supply line VBL and the precharge circuit PRCH.

The maximum value of the current flowing through the precharge circuit PRCH can be controlled by the enlargement of the gate length of the transistors comprising the precharge circuit PRCH.

Although this embodiment has been explained with an example of the bit line equalizing circuit, the same can be implemented also in the sense amplifier driving line equalizing circuit and the data line equalizing circuit.

Figure 20:
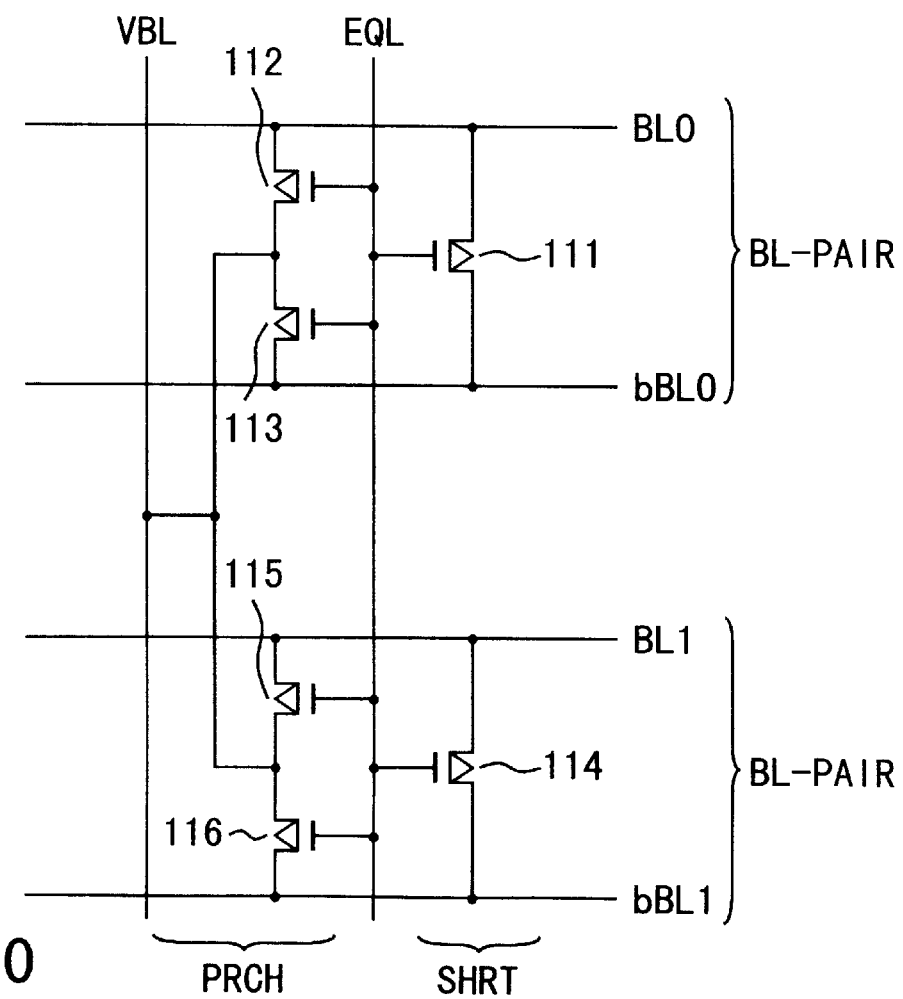
FIG. 20 is a diagram showing a configuration of a bit line equalize circuit of an eleventh embodiment.

FIG. 20 shows an equivalent circuit of the bit line equalizing circuit of an eleventh embodiment of the present invention. This is a configuration where the connection of the precharge voltage supply line VB1 and the precharge circuit PRCH is provided per a saving unit by the column redundancy.

Although a one bit line pair is used in the configuration of the above-mentioned tenth embodiment, in the configuration of this embodiment, the precharge voltage supply line VBL and the precharge circuit PRCH are connected per two bit line pair with the premise that a two bit line pair is the saving unit of the column redundancy. This can be implemented similarly also in the case the saving unit of the column redundancy is different form that of this embodiment. That is, the precharge voltage supply line VBL and the precharge circuit PRCH are connected per a three bit line pair.

Figure 21:
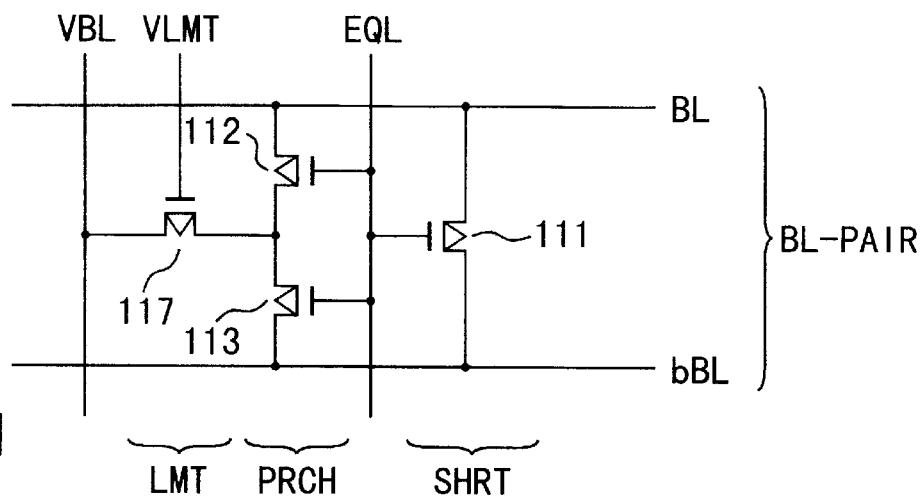
FIG. 21 is a diagram showing a configuration of a bit line equalize circuit of a twelfth embodiment.

FIG. 21 shows an equivalent circuit of the bit line equalize circuit of a twelfth embodiment of the present invention. This is a configuration where a current limiting circuit is provided between the precharge voltage supply line VBL and the precharge circuit PRCH.

In the bit line equalize circuit, the current limiting circuit LMT comprising the P-type transistor 117 is connected to the source electrodes of the P-type transistors 112, 113 of the precharge circuit PRCH. "VLMT" represents the current limiting circuit control line.

The maximum current flow from the precharge voltage supply line VBL to the bit line pair can be controlled by the enlargement of the gate length of the current limiting circuit LMT (transistor 117) and/or the gate length of the transistors comprising the precharge circuit PRCH (transistor 112 and 113).

In this configuration, the maximum current to flow in the current limiting circuit LMT (P-type transistor 117) can be controlled by driving the P-type transistor 117 by a signal applied from the current limiting circuit control line VLMT. Although an example of the bit line equalize circuit has been explained in this embodiment, the same can be applied to the sense amplifier driving line equalize circuit or the data line equalize circuit.

Figure 22:
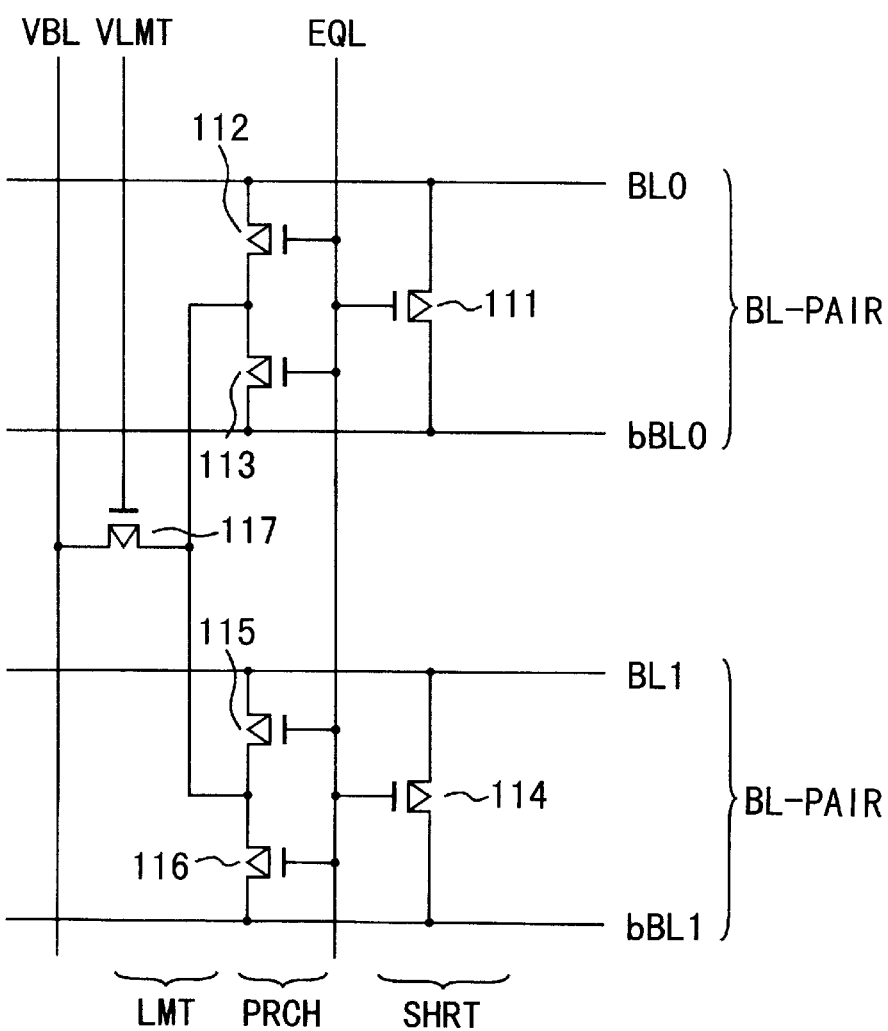
FIG. 22 is a diagram showing a configuration of a bit line equalize circuit of a thirteenth embodiment.

FIG. 22 shows an equivalent circuit of the bit line equalize circuit of a thirteenth embodiment of the present invention. This is a configuration where a current limiting circuit comprising the P-type transistor 117 is provided per the saving unit by the column redundancy. By sharing the current limiting circuit per the saving unit of the column redundancy, the installation area of the current limiting circuit can be cut back.

Although the precharge voltage supply line VBL and the precharge circuit PRCH are connected per two bit line pair with the premise that the saving unit of the column redundancy is a two bit line pair in this configuration, the same can be applied to the case where the saving unit of the column redundancy is different from that of this embodiment.

Figure 23:
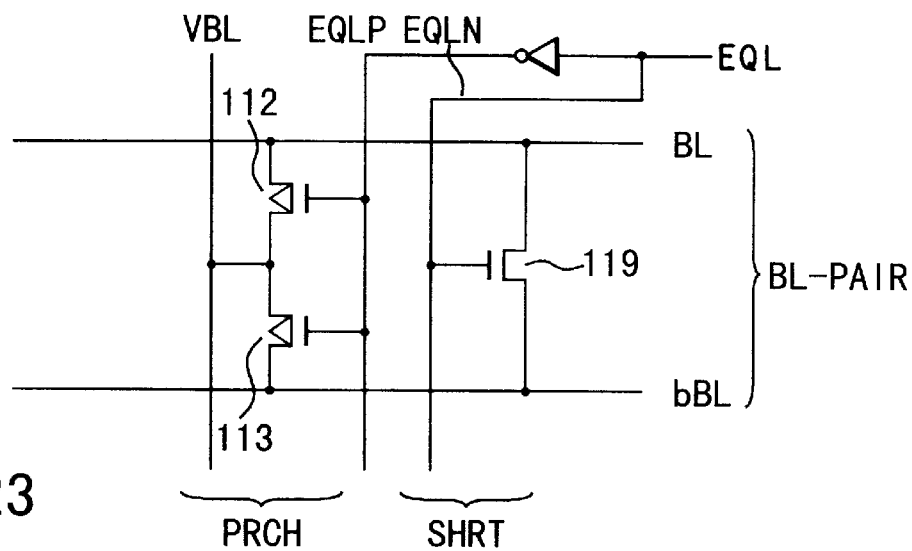
FIG. 23 is a diagram showing a configuration of a bit line equalize circuit of a fourteenth embodiment.

FIG. 23 shows an equivalent circuit of the bit line equalize circuit of a fourteenth embodiment of the present invention. This is a configuration where the equalize circuit SHRT comprises an N-type transistor 119, and the precharge circuit PRCH comprises the P-type transistors 112, 113.

In general, the voltage of the bit line BL is set at Vcc, the voltage of the bit line bBL is set at Vss, and the voltage of the VBL is set at Vcc/2 after rewiring/writing. In this case, in the equalizing operation of the bit line, a large current needs to be supplied to the equalize circuit SHRT, but since the precharge circuit PRCH mainly serves for compensating the bit line voltage at the time of the equalization, a large current is not needed. In general, in comparison between an N-type transistor and a P-type transistor having the same channel width, the N-type transistor has a larger current driving ability.

Therefore, in this embodiment, the equalize circuit SHRT where a large current is needed, comprises the N-type transistor 119. Since the function of a current limiting circuit can be added to the precharge circuit PRCH by having the precharge circuit PRCH comprising the P-type transistors 112, 113, the precharge circuit PRCH comprises the P-type transistor in this embodiment.

Although an example of the bit line equalize circuit has been explained in this embodiment, the same can be applied to the sense amplifier driving line equalize circuit, or the data line equalize circuit.

Figure 24:
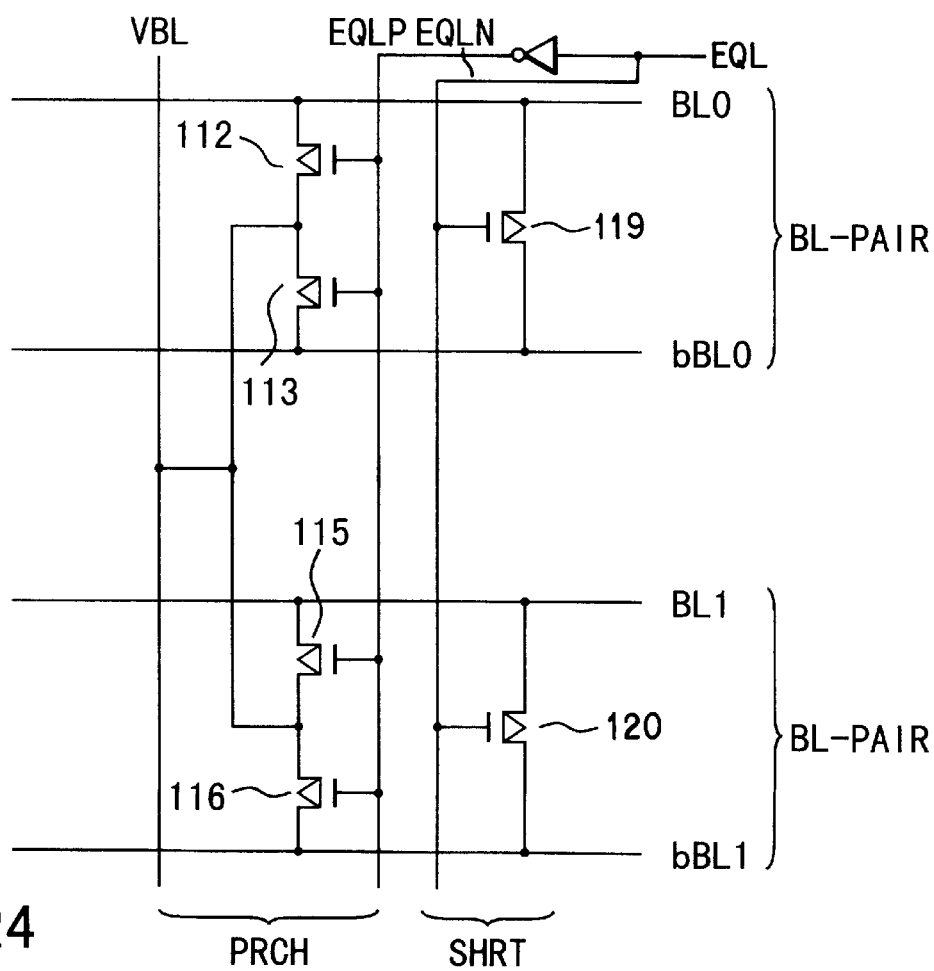
FIG. 24 is a diagram showing a configuration of a bit line equalize circuit of a fifteenth embodiment.

FIG. 24 shows an equivalent circuit of the bit line equalize circuit of a fifteenth embodiment of the present invention. This is a configuration where the precharge voltage supply line VBL and the precharge circuit PRCH are connected per the saving unit by the column redundancy.

Although the precharge voltage supply line VBL and the precharge circuit PRCH are connected per a two bit line pair with the premise that the saving unit of the column redundancy is a two bit line pair in this configuration, the same can be applied to the case where the saving unit of the column redundancy is different from that of this embodiment.

Figure 25:
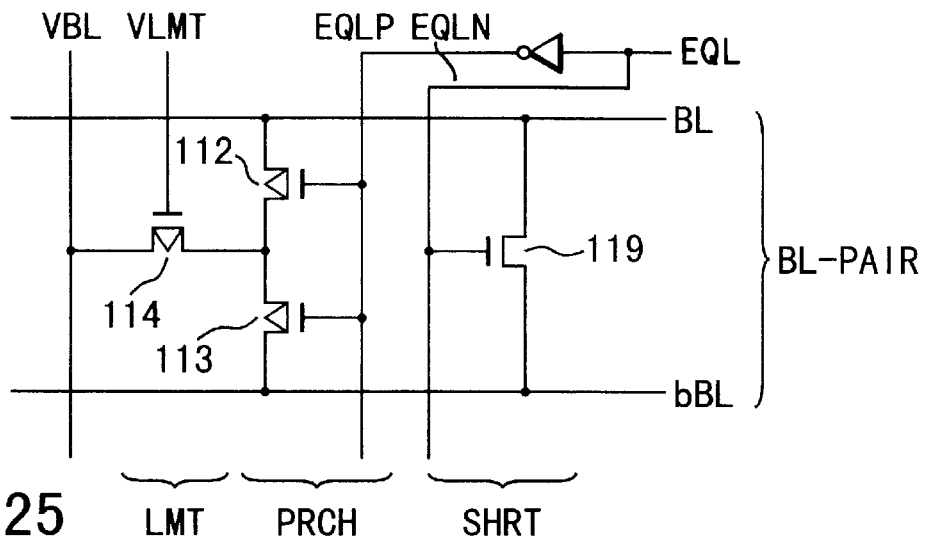
FIG. 25 is a diagram showing a configuration of a bit line equalize circuit of a sixteenth embodiment.

FIG. 25 shows an equivalent circuit of the bit line equalize circuit of a sixteenth embodiment of the present invention. This is a configuration where a current limiting circuit LMT is provided between the precharge voltage supply line VBL and the precharge circuit PRCH.

The current limiting circuit LMT comprises the P-type transistor 117. The maximum current in the transistor 117 can be controlled by the current limiting circuit control line VLMT.

Although an example of the bit line equalize circuit has been explained in this embodiment, the same can be applied to the sense amplifier driving line equalize circuit, or the data line equalize circuit.

Figure 26:
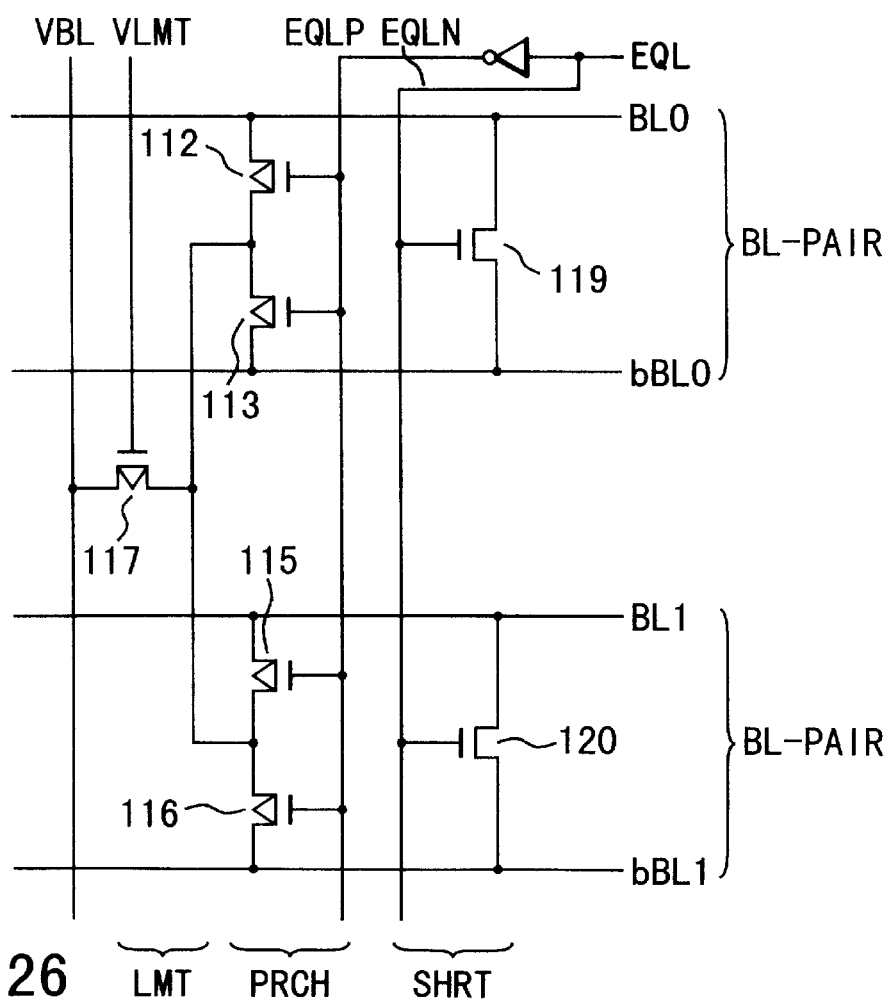
FIG. 26 is a diagram showing a configuration of a bit line equalize circuit of a seventeenth embodiment.

FIG. 26 shows an equivalent circuit of the bit line equalize circuit of a seventeenth embodiment of the present invention. This is a configuration where the current limiting circuit is provided per the saving unit of the column redundancy.

In this configuration, since the current limiting circuit LMT comprising the P-type transistor 117 is shared per the saving unit of the column redundancy, the installation area of the current limiting circuit LMT can be cut back. Although the precharge voltage supply line VBL and the precharge circuit PRCH are connected per a two bit line pair with the premise that the saving unit of the column redundancy is a two bit line pair in this configuration, the same can be applied to the case where the saving unit of the column redundancy is different from that of this embodiment.

Figure 27:
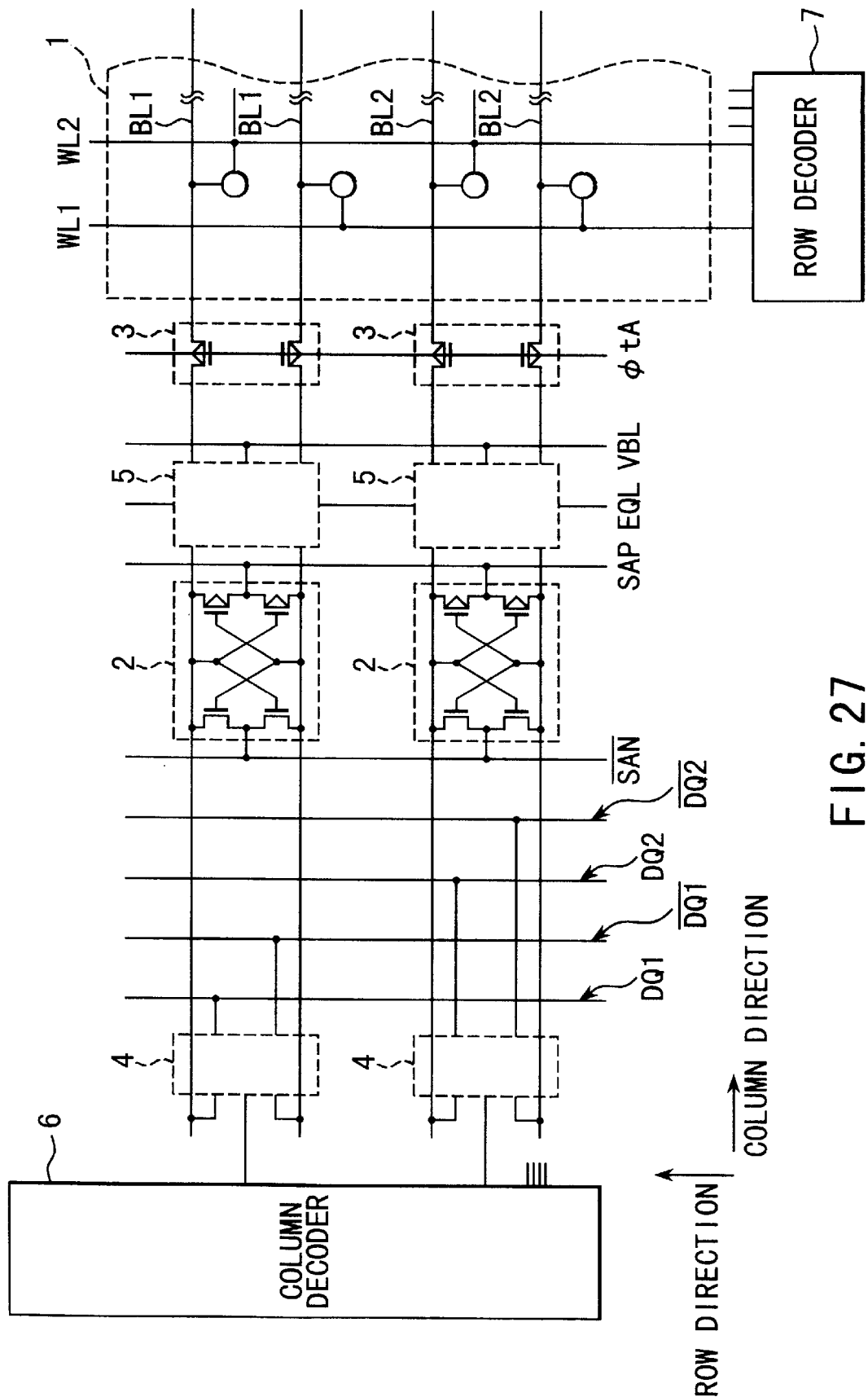
FIG. 27 is a diagram showing a schematic configuration of a dynamic type RAM (DRAM) of an eighteenth embodiment of the present invention.
Figure 28:
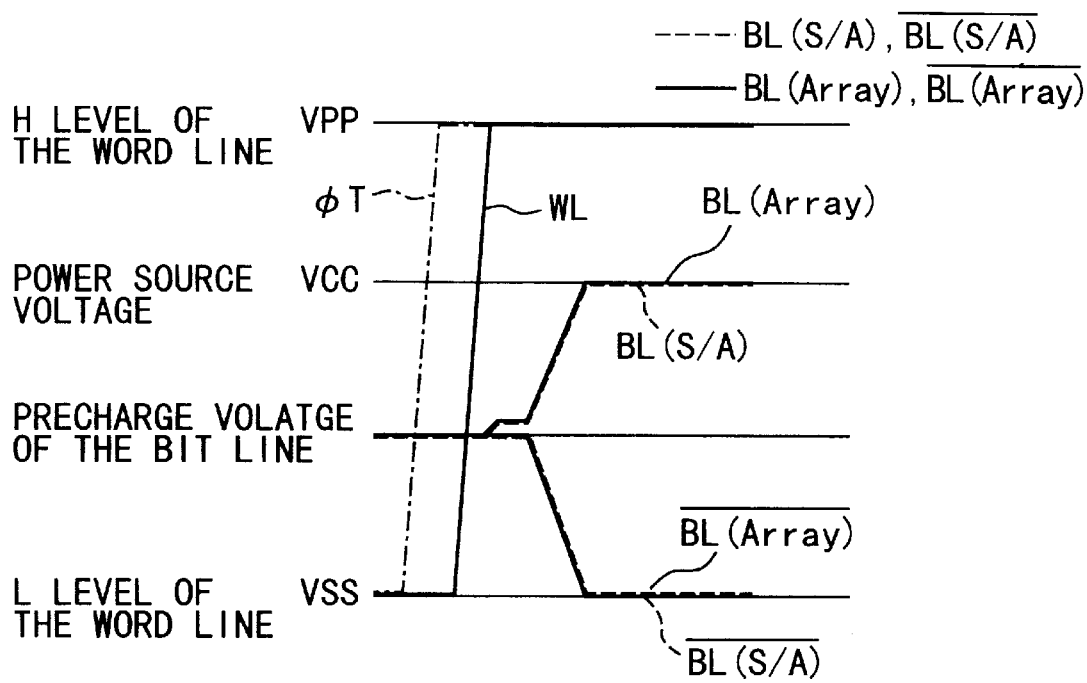
FIG. 28 is a diagram showing a conventional voltage wave form of a bit line of a sense amplifier portion, a bit line and a word line of a memory cell array portion.
Figure 29:
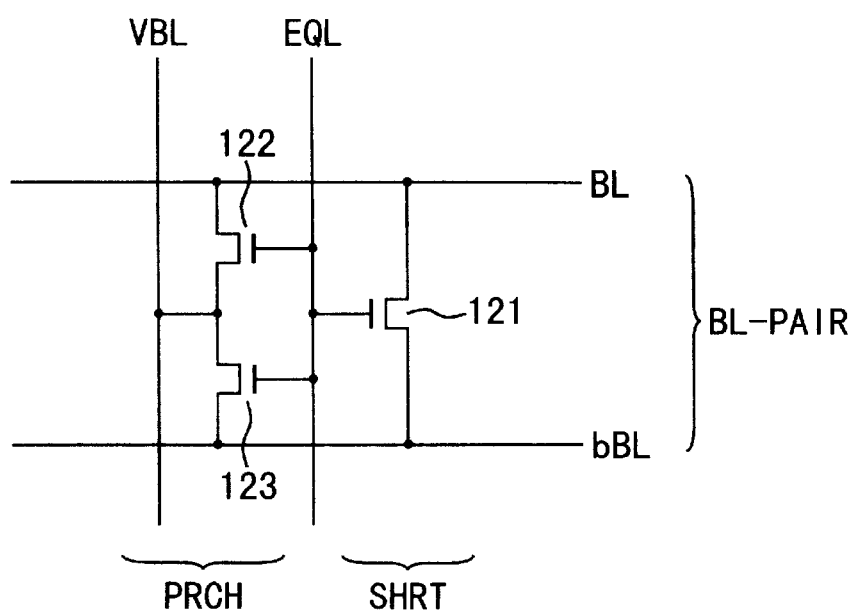
FIG. 29 is a diagram showing a configuration of a conventional bit line equalize circuit.
Figure 30:
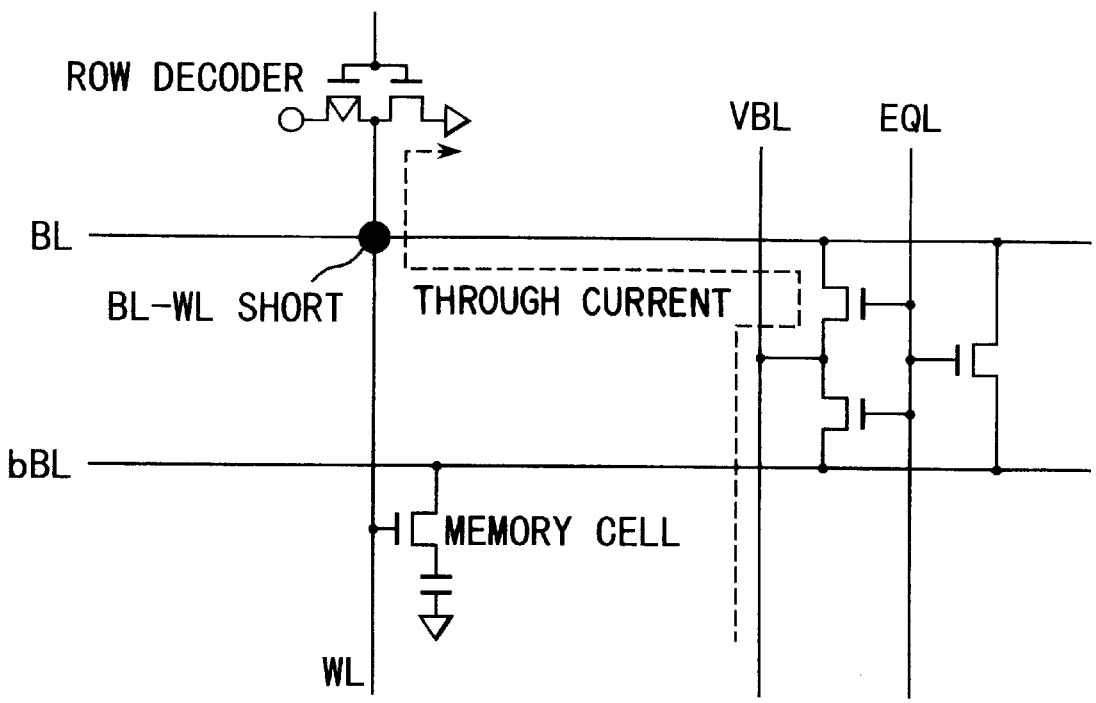
FIG. 30 is a diagram for explaining the current path when a short circuit defect is generated between the bit line and the word line in the conventional bit line equalize circuit.
Figure 31:
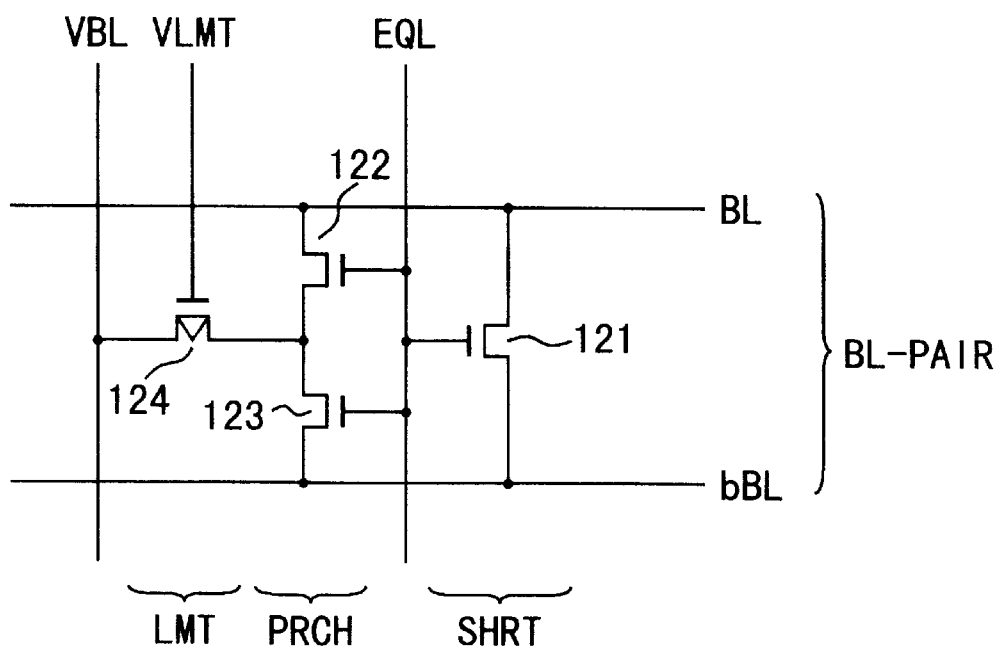
FIG. 31 is a diagram showing a configuration of the conventional bit line equalize circuit added with a current limiting circuit.

FIG. 27 is a diagram showing the block configuration of a dynamic type RAM (DRAM) of an eighteenth embodiment of the present invention.

This is a modified embodiment of the above-mentioned DRAM shown in FIG. 1.

In this configuration, compared with the configuration shown in FIG. 1, the bit line equalizer 5 is provided at the side opposite to the P-type transfer gate 3 (sense amplifier portion 2 side), and the sense amplifier portion 2 is provided at the side opposite to the column selector 4, that is, between the bit line equalizer 5 newly provided. Further, the column decoder 6 is moved to the opposite side for controlling the column selector 4, and is directly connected to the column selector 4.

In this configuration, the effect the same as the above-mentioned DRAM shown in FIG. 1 can be obtained.

As heretofore mentioned, according to the tenth to eighteenth embodiments, by having the precharge circuits such as the bit line and the sense amplifier driving line comprising the P-type transistor, the function of the current limiting circuit for limiting the through current can be provided to the precharge circuit so that the lay out area can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dynamic type RAM comprising:
   a memory cell array portion having pairs of bit lines, a plurality of word lines and a plurality of memory cells connected to the pairs of bit lines and the word lines, for electrically storing data, and a sense amplifier portion for detecting data from the bit lines through transfer gates and amplifying the data thus detected,
   wherein each of the pairs of bit lines extend in a column direction, and in said each pair of bit lines, a voltage amplitude of a signal to be applied to those parts of the bit lines which are connected to the memory cell array portion is different from a voltage amplitude of a signal to be applied to those parts of the bits lines which are connected to the sense amplifier portion, and a precharge voltage to be applied to those parts of the bit lines which are connected to the memory cell array portion is different from a precharge voltage to be applied to those parts of the bit lines which are connected to the sense amplifier portion.

2. The dynamic type RAM according to claim 1, wherein the voltage amplitude of the signal to be applied to the bit lines connected to the sense amplifier portion is larger than the voltage amplitude of the signal to be applied to the bit lines connected to the memory cell array portion, and the minimum value of the bit line signal voltage connected to the sense amplifier portion is lower than the minimum value of the bit line signal voltage connected to the memory cell array portion.

3. The dynamic type RAM according to claim 1, wherein the minimum value of the bit line signal voltage of the sense amplifier portion is lower than the minimum value of the bit line signal voltage of the memory cell array portion.

4. The dynamic type RAM according to claim 2, wherein the minimum value of the bit line signal voltage of the sense amplifier portion is lower than the minimum value of the bit line signal voltage of the memory cell array portion, and the difference between the minimum value of the bit line signal voltage of the sense amplifier portion and the minimum value of the bit line signal voltage of the memory cell array portion is at least smaller than the threshold voltage of a P-type transistor.

5. The dynamic type RAM according to claim 4, wherein the maximum value of the bit line signal voltage of the sense amplifier portion is higher than the maximum value of the bit line signal voltage of the memory cell array portion, and the difference between the maximum value of the bit line signal voltage of the sense amplifier portion and the maximum value of the bit line signal voltage of the memory cell array portion is at least larger than the threshold voltage of a N-type transistor.

6. The dynamic type RAM according to any one of claims 2 and 4, wherein the sense amplifier portion comprises an N-type sense amplifier comprising a plurality of N-type transistors and a P-type sense amplifier comprising a plurality of P-type transistors,
   wherein the N-type and P-type sense amplifiers are connected to the bit line pair of the sense amplifier portion, and
   the bit line pair of the sense amplifier portion is connected to the bit line pair of the memory cell array portion via the transfer gate comprising the P-type transistor.

7. The dynamic type RAM according to any one of claims 2 and 4, wherein the sense amplifier portion comprises an N-type sense amplifier portion comprising a plurality of N-type transistors and a P-type sense amplifier portion comprising a plurality of P-type transistors, the P and N-type sense amplifier portions are connected to the bit line pair of the sense amplifier portion and further comprise a first transfer gate comprising a P-type transistor to be connected the bit line pair connected to the sense amplifier portion for controlling the sensing operation of the N-type sense amplifier, and a second transfer gate comprising an N-type transistor to be connected to the bit line pair connected to the sense amplifier portion for controlling the sensing operation of the P-type sense amplifier.

8. The dynamic type RAM according to claim 6, wherein the sense amplifier portion conducts the sensing operation such that the voltage of one bit line of the bit line pair connected to the sense amplifier portion is lower than a predetermined low level voltage of the bit line of the memory cell array portion.

9. The dynamic type RAM according to claim 8, wherein the P-type sense amplifier portion conducts the sensing operation such that the voltage of one bit line of the bit line pair connected to the P-type sense amplifier portion is higher than a predetermined high level voltage of the bit line of the memory cell array portion.

10. The dynamic type RAM according to claim 8, wherein the sense amplifier portion conducts the sensing operation such that the voltage of one bit line of the bit line pair connected to the sense amplifier portion is lower than a predetermined low level voltage of the bit line of the memory cell array portion by the threshold voltage of the transfer gate.

11. The dynamic type RAM according to claim 7, wherein the N-type sense amplifier portion conducts the sensing operation such that the voltage of one bit line of the bit line pair connected to the sense amplifier portion is lower than a predetermined low level voltage of the bit line of the memory cell array portion by the threshold voltage of the first transfer gate, and the P-type sense amplifier portion conducts the sensing operation such that the voltage of one bit line of the bit line pair connected to the sense amplifier portion is higher than a predetermined high level voltage of the bit line of the memory cell array portion by the threshold voltage of the transfer gate.

12. The dynamic type RAM according to claim 4, wherein the precharge voltage set to the bit line pair connected to the memory cell array portion is the same as the precharge voltage set to the bit line connected to the sense amplifier portion.

13. The dynamic type RAM according to any one of claims 4 and 6, wherein the precharge voltage set to the bit line connected to the memory cell array portion is in the range between the high level voltage and the low level voltage preliminarily set to the bit line connected to the memory cell array portion, and the precharge voltage of the bit line connected to the sense amplifier portion is in the range between the high level voltage and the low level voltage preliminarily set to the bit line connected to the sense amplifier portion.

14. The dynamic type RAM according to claim 5, wherein the precharge voltage set to the bit line connected to the memory cell array portion is in the range between the high level voltage and the low level voltage preliminarily set to the bit line connected to the memory cell array portion, and the precharge voltage of the bit line connected to the N-type sense amplifier portion and the P-type sense amplifier portion is in the range between the high level voltage and the ground voltage preliminarily set to the word line.

15. The dynamic type RAM according to any one of claims 4 and 5, wherein the precharge voltage of the bit line connected to the memory cell array portion is in the range between the high level voltage and the low level voltage preliminarily set to the bit line connected to the memory cell array portion, and the precharge voltage of the bit lines connected to the N-type sense amplifier portion and the P-type sense amplifier portion is the same as the high level voltage or low level voltage preliminarily set at the bit line connected to the memory cell array portion.

16. A dynamic type RAM comprising: a memory cell array portion having pairs of bit lines, a plurality of word lines and a plurality of memory cells connected to the pairs of bit lines and the word lines, for electrically storing data, and a sense amplifier portion for detecting data from the bit lines through transfer gates and amplifying the data thus detected, wherein the transfer gates are P-type transfer gates each comprising a PMOS transistor, and a constant voltage generating means is provided for applying a variable DC voltage generated in a chip, to electrodes of the P-type transfer gates to set the P-type transfer gates in a conducting state.

17. The dynamic type RAM according to claim 16, wherein the constant voltage generating means comprises a threshold voltage fluctuation compensating means for detecting the threshold voltage fluctuation of a plurality of preliminarily determined transistors integrated in the chip and changing according to the threshold voltage fluctuation value in a self aligning manner so as to generate an output signal applied with the change compensation, and a P-type transfer gate driving means for driving the P-type transfer gate with the output signal generated by the threshold voltage fluctuation compensating means as the standard signal.

18. The dynamic type RAM according to claim 16, wherein the constant voltage generating means comprises a threshold voltage fluctuation compensating means for detecting the threshold voltage fluctuation of at lease one of preliminarily determined transistors integrated in the chip and changing according to the threshold voltage fluctuation value in a self aligning manner so as to generate an output signal applied with the change compensation, and a P-type transfer gate driving means for driving the P-type transfer gate with the output signal generated by the threshold voltage fluctuation compensating means as the standard signal.

19. The dynamic type RAM according to claim 18, wherein the threshold voltage fluctuation compensating means is a threshold voltage fluctuation compensating means for detecting the threshold voltage fluctuation of any one or both selected from the group consisting of a transistor provided in the memory cell and the PMOS transistor comprising the P-type transfer gate and outputting an output signal following the fluctuation in a self aligning manner to the P-type transfer gate driving means.

20. The semiconductor memory device according to claim 19, wherein the constant voltage generating means further comprises a current booster means for reducing the output impedance of the constant voltage generating means.

21. The semiconductor memory device according to claim 20, wherein the current booster means is connected to the output side of the threshold voltage fluctuation compensating circuit.

22. The dynamic type RAM according to claim 19, wherein the threshold voltage fluctuation compensating means comprises a threshold value monitoring transistor having the same operation characteristic and threshold voltage as either the transistor provided in the memory cell or the PMOS transistor comprising the P-type transfer gate, a constant current source for controlling such that a constant voltage can flow in the threshold voltage monitoring transistor, a differential amplifying device for comparing the preliminarily set standard signal and the signal flowing in the threshold voltage monitoring transistor, and a drive transistor driven by the output signal from the differential amplifying device f, a driving the threshold voltage monitoring transistor.

23. A dynamic type RAM comprising: a memory cell array portion comprising a plurality of memory cells capable of writing and reading data electrically, where a complementary line pair is connected to the memory cells, a first signal line and a second signal line comprising the complementary line pair, a precharge voltage supply line for supplying a precharge voltage to the first signal line and the second signal line, an equalize circuit provided between the first signal line and the second signal line, a first precharge circuit provided between the first signal line and the precharge voltage supply line, a second precharge circuit provided between the second signal line and the precharge voltage supply line, wherein at least one selected from the group consisting of a transistor comprising the first equalize circuit, a transistor comprising a first precharge circuit, and a transistor comprising the second precharge circuit comprises a P-type transistor.

24. The dynamic type RAM according to claim 23, wherein the transistor comprising the first precharge circuit and the transistor comprising the second precharge circuit comprise P-type transistors.

25. The dynamic type RAM according to claim 23, wherein the transistor comprising the equalize circuit, the transistor comprising the first precharge circuit and the transistor comprising the second precharge circuit comprise P-type transistors.

26. The dynamic type RAM according to any one of claims 23, 25, and 26, wherein the first signal line and the first signal line in the complementary line pair comprise a bit line.

27. The dynamic type RAM according to any one of claims 23, 25, and 26, wherein the first signal line and the second signal line in the complementary line pair comprise a data line for writing and reading data with respect to the memory cell through a pair of column gate.

28. The dynamic type RAM according to any one of claims 24, and 26, wherein a first current limiting circuit is provided between the first precharge circuit and the first precharge voltage supply line, and a second current limiting circuit is provided between the second precharge circuit and the first precharge voltage supply line.

29. The dynamic type RAM according to any one of claims 24, and 25, wherein one end of the first precharge circuit is connected to the first signal line, the other end of the first precharge circuit is connected to one end of the first current limiting circuit, one end of the second precharge circuit is connected to the second signal line, the other end of the second precharge circuit is connected to one end of the first current limiting circuit, and the other end of the first current limiting circuit is connected to the first precharge voltage supply line.

30. The dynamic type RAM according to claim 28, wherein the current limiting circuit comprises a P-type transistor.

31. The dynamic type RAM according to claim 28, wherein the first precharge circuit, the second precharge circuit, the first current limiting circuit and the second current limiting circuit are formed in an active region surrounded by an element isolation region.

32. The dynamic type Ram according to claim 29, wherein the first precharge circuit, the second precharge circuit, and the first current limiting circuit are formed in an active region surrounded by an element isolation region.

33. The dynamic type RAM according to claim 32, wherein the first equalize circuit, the first precharge circuit, the second precharge circuit, and the first current limiting circuit are formed in an active region surrounded by an element isolation region.

34. The dynamic type RAM according to claim 31, wherein the first and second current limiting circuits are provided per a substitution unit of the column redundancy.

35. The dynamic type RAM according to claim 32, wherein the first current limiting circuit is provided per a substitution unit of the column redundancy.

36. A semiconductor memory device comprising the dynamic type RAM according to claim 34, wherein the first precharge circuit, the second precharge circuit, the first current limiting circuit and the second current limiting circuits are provided per a substitution unit of the column redundancy in the same element area.

37. The dynamic type RAM according to claim 35, wherein the first precharge circuit, the second precharge circuit, and the first current limiting circuit are provided per a substitution unit of the column redundancy in the same element area.

38. The dynamic type RAM according to claim 35, wherein the first equalize circuit, the first precharge circuit, the second precharge circuit, the second precharge circuit, and the first current limiting circuit are provided per a substitution unit of the column redundancy in the same element area.

39. The dynamic type RAM according to claims 24 and 25, wherein the gate length of the transistor comprising the first precharge circuit and the gate length of the transistor comprising the second precharge circuit are longer than the gate length of the transistor comprising the equalize circuit.

40. The dynamic type RAM according to claim 36, wherein the gate length of the transistor comprising current limiting circuit is longer than the gate length of the transistor comprising the equalize circuit.

41. The dynamic type RAM according to claim 40, wherein the gate length of the transistor comprising the first precharge circuit and the gate length of the transistor comprising the second precharge circuit are longer than the gate length of the transistor comprising the equalize circuit.

42. The dynamic type RAM according to claim 41, wherein the gate length of the transistor comprising the first precharge circuit is equal to the gate length of the transistor comprising the current limiting circuit, and the gate length of the transistor comprising the second precharge circuit is equal to the gate length of the transistor comprising the current limiting circuit.

* * * * *

UNITED STATES PATENT AND TRADEMARK OFFICE
CERTIFICATE OF CORRECTION

PATENT NO. : 6,181,618 B1
DATED : January 30, 2001
INVENTOR(S) : Tsuneo Inaba, *et al.*

It is certified that error appears in the above-identified patent and that said Letters Patent is hereby corrected as shown below:

Claim 6, column 24,
Line 53, "4" has been replaced with -- 3 --.

Claim 7, column 24,
Line 64, "4" has been replaced with -- 3 --.

Claim 13, column 25,
Line 49, "6" has been replaced with -- 5 --.

Signed and Sealed this

Twenty-fifth Day of September, 2001

Attest:

NICHOLAS P. GODICI
*Acting Director of the United States Patent and Trademark Office*

*Attesting Officer*

UNITED STATES PATENT AND TRADEMARK OFFICE
CERTIFICATE OF CORRECTION

PATENT NO. : 6,181,618 B1
DATED : January 30, 2001
INVENTOR(S) : Tsuneo Inaba et al.

It is certified that error appears in the above-identified patent and that said Letters Patent is hereby corrected as shown below:

<u>Column 27,</u>
Line 44, "25, and 26" has been deleted and replaced with -- 24, and 25 --,
Line 48, "25, and 26" has been deleted and replaced with -- 24, and 25 --,
Line 53, "26" has been replaced with -- 25 --, <u>Column 28,</u>
Line 48, "36" has been replaced with -- 30 --.

Signed and Sealed this

Thirteenth Day of August, 2002

*Attest:*

JAMES E. ROGAN
*Attesting Officer*     *Director of the United States Patent and Trademark Office*